United States Patent [19]
Tagusa et al.

[11] Patent Number: 5,668,700
[45] Date of Patent: Sep. 16, 1997

[54] PANEL ASSEMBLY STRUCTURE CAPABLE OF CONNECTING WIRING LINE WITH ELECTRODE AT FINE PITCH

[75] Inventors: Yasunobu Tagusa, Ikoma; Shigeo Nakabu, Nara, both of Japan

[73] Assignee: Sharp Kabushiki Kaisha, Osaka, Japan

[21] Appl. No.: 505,844

[22] Filed: Jul. 24, 1995

[30] Foreign Application Priority Data

Aug. 4, 1994 [JP] Japan .................... 6-183267

[51] Int. Cl.⁶ .................... H05K 7/02; H05K 7/06
[52] U.S. Cl. .................... 361/779; 361/767; 361/771; 439/91; 349/150
[58] Field of Search .................... 361/760, 767, 361/769, 771, 777, 779; 174/259; 439/66, 67, 91; 349/149, 150, 152

[56] References Cited

U.S. PATENT DOCUMENTS

| | | | |
|---|---|---|---|
| 4,644,445 | 2/1987 | Sakuma | 361/779 |
| 5,001,302 | 3/1991 | Atsumi | 439/91 |
| 5,042,919 | 8/1991 | Yabu et al. | 349/150 |
| 5,089,750 | 2/1992 | Hatada et al. | 349/150 |
| 5,161,009 | 11/1992 | Tanoi et al. | 349/150 |
| 5,180,888 | 1/1993 | Sugiyama et al. | 439/66 |

FOREIGN PATENT DOCUMENTS

| | | |
|---|---|---|
| 4-242721 | 8/1992 | Japan . |
| 6-4582 | 2/1994 | Japan . |

OTHER PUBLICATIONS

Semiconductor World, 93 special No., pp. 249–252, Kenzou Hatada, "Driver IC assembling technique".

Primary Examiner—Leo P. Picard
Assistant Examiner—John B. Vigushin
Attorney, Agent, or Firm—Nixon & Vanderhye P.C.

[57] ABSTRACT

There is provided a highly reliable panel assembly structure capable of performing fine-pitch high-density assembling at a high yield and a low cost. A flexible wiring board has a film-like substrate with flexibility, and an IC chip is mounted in an area. In the area is provided a through hole that has plane dimensions smaller than plane dimensions of the chip and penetrates the substrate. Portions that belong respectively to an output side wiring line and an input side wiring line provided on a substrate surface and are connected respectively to an output side electrode and an input side electrode of the chip via second connection materials and are supported by the substrate surface. An output terminal of the flexible wiring board is connected to an electrode terminal formed at a peripheral portion of a panel via a first connection material, while an input terminal of the flexible wiring board is connected to an electrode terminal of a circuit board via a third connection material.

7 Claims, 11 Drawing Sheets

PANEL ASSEMBLY STRUCTURE CAPABLE OF CONNECTING WIRING LINE WITH ELECTRODE AT FINE PITCH

BACKGROUND OF THE INVENTION

1. Field of the Invention

The present invention relates to a panel assembly structure, an integrated circuit mounting tape, and a manufacturing method thereof. The present invention relates, in particular, to a panel assembly structure in which an output terminal comprised of a part of an output side wiring line of a flexible wiring board is connected to an electrode terminal formed at a peripheral portion of a panel, and an input terminal comprised of a part of an input side wiring line of the flexible wiring board is connected to an electrode terminal of a wiring board for supplying a signal to an integrated circuit for driving the panel. The present invention also relates to an integrated circuit mounting tape in a state in which a substrate of the flexible wiring board extends in one direction and a manufacturing method thereof.

2. Description of the Prior Art

Among various sorts of panels implemented by EL (Electroluminescence), plasma, liquid crystals, a line sensor, a line printer and the like, the liquid crystal display (LCD) panel will be described as an example. FIG. 16 shows a perspective view of a prior art LCD device, while FIG. 17 shows a sectional view of the device taken along a line XVII—XVII in FIG. 16.

As shown in FIG. 16, the above-mentioned LCD device includes a LCD panel 101 and flexible wiring boards 104 and 105 where drive ICs (integrated circuit chips) 102 and 103 for driving the display panel 101 are mounted respectively on substrates 140 and 141 made of polyimide resin or the like. There are further provided a control board 107 for outputting a control signal and the like for driving the LCD panel 101 and transmitting the control signal to each flexible wiring board 105, and a wiring board 106 for transmitting the control signal to each flexible wiring board 104.

As shown in FIG. 17, the LCD panel 101 is formed by sealingly filling liquid crystals 110 into a space between a pair of glass substrates 108 and 109, and image display can be effected in the area in which the liquid crystals 110 are sealedly filled. A plurality of electrode terminals 112 comprised of a single layer or a multiplicity of layers made of such materials as ITO (Indium Tin Oxide), Ti, Ta, Mo, Al and TaN are arranged on a peripheral portion 111 of one glass substrate 108.

Each flexible wiring board 104 has a rectangular film-like substrate 140. As shown in FIG. 18, a through hole 142 having plane (length and width) dimensions greater than plane dimensions of the drive IC 102 is provided in an approximate center portion of a substrate surface 140s. An output side wiring line 114a and an input side wiring line 114b each connected to the drive IC 102 are provided on the substrate surface 140s. Portions 114e and 114f that belong respectively to the output side wiring line 114a and the input side wiring line 114b and are located on the peripheral side of the substrate surface 140s serve respectively as an output terminal and an input terminal of the flexible wiring board 104. On the other hand, as shown in FIG. 17, the output side wiring line 114a and the input side wiring line 114b are connected respectively to an output side electrode 113a and an input side electrode 113b of the drive IC 102 at their portions 114c and 114d that extend inside the through hole 142. An amount of protrusion 1b from the substrate surface 140s of the output side wiring line 114a and the input side wiring line 114b is set to a value of $1.8 \times 10^{-2}$ mm or more. In an area where input terminals 114f are arranged on the substrate surface 140s is provided a slit 115 that penetrates the substrate 140. Each flexible wiring board 105 has approximately the same construction as that of the flexible wiring board 104.

The wiring board 106 is provided with an electrode terminal 117 that is connected to a bus line 116 and corresponds to the input terminal 114f of the flexible wiring board 104.

In a state of assembly, the electrode terminal 112 at the peripheral portion 111 of the LCD panel 101 and the output terminal 114e of the flexible wiring board 104 are connected with each other via an anisotropic conductive film 118. On the other hand, the input terminal 114f of the flexible wiring board 104 and the electrode terminal 117 of the wiring board 106 are connected with each other by means of solder 119. In detail, as shown in FIG. 19, the electrode terminal 112 of the LCD panel 101 and the output terminal 114e of the flexible wiring board 104 are connected with each other by heating or like means with interposition of the anisotropic conductive film 118 while receiving a pressure from a pressure head 137a on a stage 137b. Such an assembling technique is disclosed in Semiconductor World, special number, '93, new liquid crystal display process techniques, pp. 249–252, "driver IC assembling technique".

FIG. 20 shows another assembly structure of an LCD panel (Japanese Patent Laid-Open Publication No. HEI 4-242721). The LCD device shown in FIG. 20 includes an LCD panel 120, a flexible wiring board 122 mounted with a drive IC 121, and a wiring board 123 for transmitting a control signal to the drive IC 121. The LCD panel 120 is formed by sealingly filling liquid crystals 126 into a space between a pair of glass substrates 124 and 125, and a plurality of electrode terminals 128 are formed at a peripheral portion 127 of one glass substrate 125. The wiring board 123 is integratedly mounted to a peripheral portion 127 of the one glass substrate 125. The flexible wiring board 122 has an output side wiring line 133a, an input side wiring line 133b, and a protection film 134 on a film-like substrate 132 having no through hole. The output side wiring line 133a and the input side wiring line 133b are connected respectively to an output side electrode 122a and an input side electrode 122b of the drive IC 121 via an anisotropic conductive film (not shown) at their portions 133c and 133d exposed inside an opening of a protection film 135. The wiring board 123 has an electrode terminal 129 for transmitting a control signal to the drive IC 121 on its surface 123a mounted to the peripheral portion 127 of the glass substrate 125 of the LCD panel 120.

Then, an electrode terminal 128 at a peripheral portion 127 of the LCD panel 120 and an output terminal 133e comprised of a part of the output side wiring line 133a of the flexible wiring board 122 are connected with each other via an anisotropic conductive film (not shown). On the other hand, an input terminal 133f comprised of a part of the input side wiring line 133b of the flexible wiring board 122 and an electrode terminal 129 of the wiring board 123 are connected with each other via an anisotropic conductive film (not shown).

A pitch of the connection portion between the glass substrate 125 and the flexible wiring board 122 is set to, for example, $1.6 \times 10^{-1}$ mm, a pitch of the connection portion between the flexible wiring board 122 and the drive IC 121 is set to, for example, $2.3 \times 10^{-1}$ mm, and a pitch of the connection portion between the flexible wiring board 122 and the wiring board 123 is set to, for example, 0.7 mm.

Conventionally, as shown in FIG. 21, when terminals of two substrates, for example, the terminals of the drive IC 121 and the terminals of the slitless flexible wiring board 122 are connected with each other, positional reconditioning is effected by confirming alignment marks (not shown) of both the substrates 125 and 122 by means of two cameras 130 and 131, and thereafter the flexible wiring board 122 is moved by a specified length L. By the above-mentioned operation, the board 122 is superposed on the drive IC 121, so that the terminals are made to face each other. It is to be noted that sometimes only one camera is used to recondition the position of one substrate.

Such a thin type panel for use in a display, a sensor or the like as represented chiefly by an LCD panel, has the advantageous features of thin configuration, small size, light weight, low power consumption, and so forth in comparison with a display panel such as a cathode ray tube. For the above reasons, there has been a growing demand for using such a thin type panel in portable television sets, personal computers, pen input type electronic pocketbooks, in-car displays, industrial use displays, image readers, and so forth. Meanwhile, each thin type panel has been required to achieve further improvement of the performance thereof as a high-class information display device or an image reader, finer image display, and reduction in dimensions and cost by high-density assembling of components on the periphery of the display panel. Therefore, drive IC mounting technique has acquired greater importance.

If the above-mentioned demands are reflected on the prior art assembly structure shown in FIG. 17, there are required pitches of not greater than 0.1 mm, $8.0 \times 10^{-2}$ mm and 0.4 mm respectively in the connection portion between the LCD panel 101 and the flexible wiring board 104, the connection portion between the flexible wiring board 104 and the drive IC 102, and the connection portion between the flexible wiring board 104 and the wiring board 106. Responding to the demands, some components such as a connection material are now under development so as to conform to a fine pitch.

However, in order to achieve the above-mentioned high-density assembling at a fine pitch stably with good mass-productivity, there are demanded, in addition to development of an appropriate connection material, the following requirements of:

(1) improving etching accuracy of the wiring lines 114a and 114b of the flexible wiring board 104;

(2) improving accuracy in aligning boards; and (3) suppressing possible misalignment between mutually opposite electrode terminals attributed to a difference in coefficient of thermal expansion between boards made of different materials and slip of a connection material when it is melted.

In order to improve the etching accuracy of the flexible wiring board 104 (the above-mentioned requirement (1)), as known by persons skilled in the art, the amount of protrusion 1b from the substrate surface 140s of the wiring lines 114a and 114b is required to be reduced to, for example, $1.8 \times 10^{-2}$ mm or less. However, when the amount of protrusion 1b is set to $1.8 \times 10^{-2}$ mm or less, since the portions (terminals) 114c and 114d of the wiring lines 114a and 114b are protruding inside the through hole 142 without being supported by the substrate 140, there occurs a problem that the terminals 114c and 114d are bent in the manufacturing processes. Consequently, the above causes an increased number of cases of shortcircuit of the terminals 114c and 114d and an increased number of cases of imperfect connection of the terminals 114c and 114d with the output side electrode 113a and the input side electrode 113b of the drive IC 102, resulting in a reduced yield and a difficulty in fine-pitch connection.

Furthermore, since the input terminals 114f of the flexible wiring board 104 and the electrode terminals 117 of the wiring board 106 are connected with each other via solder 119, there has not been achieved fine-pitch connection at a pitch of not greater than 0.6 mm at the mass production level.

Further, the prior art assembly structure as shown in FIG. 20 has the problems:

(1) that, when the drive IC 121 is aligned by a system as shown in FIG. 21 or the like in being mounted onto the flexible wiring board 122, a poor positional alignment accuracy results due to a misalignment in the positional reconditioning between the cameras 130 and 131 and a mechanical variation in amount of movement L; and (2) that, when the drive IC 121 is connected to the flexible wiring board 122, there easily occur a misalignment between the mutually opposite terminals due to a difference between coefficients of thermal expansion of the drive IC 121 and the flexible wiring board 122 and a reduction in reliability at the connection portions after the connecting process due to the influence of a residual stress.

SUMMARY OF THE INVENTION

The object of the present invention is therefore to provide a highly reliable panel assembly structure capable of performing fine-pitch high-density assembling at a high yield and a low cost, and provide an integrated circuit mounting tape for use in such a panel assembly structure and a manufacturing method thereof.

In order to achieve the aforementioned object, the present invention provides a panel assembly structure including: a flexible wiring board provided with a film-like substrate having a flexibility; an integrated circuit chip mounted in a specified area on a surface of the substrate, said integrated circuit chip having an output side electrode and an input side electrode connected respectively with an output side wiring line and an input side wiring line provided on the surface of the substrate each via a second connection material; a panel of which a peripheral portion has an electrode terminal, said electrode terminal being connected with an output terminal comprised of a part of the output side wiring line of the flexible wiring board via a first connection material; and a wiring board which has an electrode terminal for supplying a signal to the integrated circuit chip, said electrode terminal being connected with an input terminal comprised of a part of the input side wiring line of the flexible wiring board via a third connection material, wherein an area which belongs to the surface of the substrate of the flexible wiring board and in which the integrated circuit chip is mounted is provided with a through hole which penetrates the substrate and has plane (length and width) dimensions smaller than plane dimensions of the integrated circuit chip, and portions which belong respectively to the output side wiring line and the input side wiring line and are connected respectively with the output side electrode and the input side electrode of the integrated circuit chip are supported by the surface of the substrate around the through hole.

According to the above-mentioned panel assembly structure, the through hole having plane dimensions smaller than the plane dimensions of the integrated circuit (IC) chip is provided in the area which belongs to the substrate surface of the flexible wiring board and in which the IC chip is mounted. In addition, the portions which belong to the output side wiring line and the input side wiring line of the flexible wiring board and are connected to the output side electrode and the input side electrode of the IC chip are supported by the substrate surface around the through hole. Therefore, the portions do not bend in the process of mounting the IC chip or other manufacturing processes. Therefore, the amount of protrusion from the substrate surface of the output side wiring line and the input side wiring line of the flexible wiring board can be reduced (the thickness of each wiring layer is made thin) further than in the prior art. The amount of protrusion can be set to, for example, $1.8 \times 10^{-2}$ mm or less. When the amount of protrusion is set to such a reduced value, the output side wiring line and the input side wiring line are finished with high etching accuracy. Therefore, connection of the output side wiring line and the input side wiring line with the output side electrode and the input side electrode of the IC chip is performed at a pitch finer than that of the prior art. Furthermore, connection of the output terminal comprised of a part of the output side wiring line with the electrode terminal of the panel and connection of the input terminal comprised of a part of the input side wiring line with the electrode terminal of the wiring board can be also performed at a fine pitch.

On the other hand, the through hole is formed in the area in which the IC chip is mounted, whereby a superfluous substrate portion is removed. Furthermore, by virtue of the non-existence of the substrate portion that extends more than the IC chip, a reduced thermal stress results. Furthermore, by virtue of the non-existence of the substrate portion, the required amount of heat to be applied is reduced to allow the temperature of heating to be reduced. The above-mentioned factors effect synergistically, so that the possible misalignment between the electrodes of the IC chip and the terminal portions of the wiring line of the flexible wiring board due to the influence of the thermal expansion of the substrate material in the process of mounting the IC chip by thermocompression bonding can be reduced. Consequently, a connection area is assured between the terminals, so that the connection reliability is improved. Furthermore, a residual stress of the substrate is also reduced, and therefore the reliability of connection between the mutually opposite terminals can be further improved. Furthermore, the residual stress is also reduced by the synergistic effect of the non-existence of the member which may generate residual stress in the vicinity of the terminals by virtue of the reduction of the material due to the provision of the through hole and the reduction in temperature of heating by virtue of the reduction in required thermal capacity in the thermocompression bonding process.

Furthermore, for example, by extending in a specified pattern a part of the wiring layer from on the substrate surface around the through hole to the inside of the through hole in the area of the through hole at the substrate surface of the flexible wiring board, an alignment mark corresponding to the IC chip can be provided. In the above-mentioned case, an alignment mark is also provided at the IC chip, and positional alignment is achieved by observing both the alignment marks through the above-mentioned through hole. Accordingly, there is no need to perform the positional alignment with the complicated system as in the prior art, thereby allowing fine-pitch terminals to be aligned with each other with high accuracy.

According to the panel assembly structure of an embodiment, the second connection material for connecting the output side electrode and the input side electrode of the IC chip respectively with the output side wiring line and the input side wiring line of the flexible wiring board is provided by solder.

In the above-mentioned case, the second connection material can be supplied to each IC in a wafer state before the wafer is divided into individual IC chips. When the second connection material is supplied to each IC in the wafer state, the material can be supplied at a lower cost than when it is supplied to each one in a chip state. Furthermore, rework (restoration of defective components) can be facilitated after the IC chip is mounted on the substrate surface, consequently allowing the manufacturing cost to be reduced.

According to the panel assembly structure of an embodiment, the second connection material is provided by an anisotropic conductive film.

In the above-mentioned case, the second connection material can be supplied to a tape-shaped (sheet-shaped rolled) material before the tape-shaped material is divided into individual flexible wiring boards. When the second connection material is supplied to the tape-shaped material, the connection material can be easily automatically supplied at a cost lower than in the case where the connection material is supplied to each one in a chip form. Furthermore, when the second connection material is provided by an anisotropic conductive film, the terminal material can be selected from various sorts of terminal materials to be used for the connection in comparison with the case of solder. For instance, an inexpensive material of aluminum can be selected, for example, as a material for the output side wiring line and the input side wiring line of the flexible wiring board, and consequently a reduced cost can be achieved. Furthermore, by adopting an anisotropic conductive film as the first, second, and third connection materials, an identical sort of connection material can be used as the connection materials.

According to the panel assembly structure of an embodiment, the first, second and third connection materials are provided by a connection material of an identical sort.

In the above-mentioned case, the connection material of the identical sort is used, however, the reliability of connection portions using the first, second and third connection materials of different types can be adjusted to the same level. Furthermore, no matter which the connection materials are of the same type or of different types, a plurality of connection portions can be simultaneously connected by one connecting apparatus. Therefore, a reduced number of manufacturing processes can be achieved. Further, the apparatuses necessary for obtaining a specified throughput can be reduced in number, thereby allowing an investment cost for an equipment to be reduced. Further, as a result of the reduction in number of apparatuses, the occupation area of the processes in a factory can be reduced. Therefore, a substantial cost reduction can be achieved.

According to the panel assembly structure of an embodiment, the first, second and third connection materials are provided integratedly.

With the above-mentioned arrangement, the first, second and third connection materials can be supplied to a normally rolled substrate material simultaneously by one supply apparatus. Therefore, the manufacturing processes can be reduced in number. Further, the apparatuses necessary for obtaining a specified throughput can be reduced in number, thereby allowing an investment cost for the equipment to be reduced. Further, as a result of the reduction in number of apparatuses, the occupation area of the processes in the factory can be reduced. Therefore, a substantial cost reduction can be achieved.

According to the panel assembly structure of an embodiment, at least one of the area in which the IC chip is mounted and the area in which the output terminal is formed, said areas belonging to the flexible wiring board, has a thickness set smaller than a thickness of the other area of the substrate of the flexible wiring board.

With the above-mentioned arrangement, there is achieved a reduced difference in temperature distribution in the direction of the thickness of the area in the connecting process. Therefore, the temperature of heating can be set low. When the temperature of heating is set low, if a difference in coefficient of thermal expansion exists between the panel and the flexible wiring board to be connected with each other or between the IC chip and the flexible wiring board to be connected with each other, the resulting residual stress due to the difference in coefficient of thermal expansion can be reduced after the connecting process. Furthermore, the arrangement that the thickness of the substrate of the flexible wiring board is thin can also reduce the total amount of residual stress. Therefore, the reliability of the connection portions can be improved.

According to the panel assembly structure of an embodiment, the panel and the wiring board are formed integratedly.

With the above-mentioned arrangement, connection on the output terminal side and connection on the input terminal side of the flexible wiring board can be simultaneously performed by one connecting apparatus. Therefore, the manufacturing processes can be reduced in number. Further, the apparatuses necessary for obtaining a specified throughput can be reduced in number, thereby allowing an investment cost for the equipment to be reduced. Further, as a result of the reduction in number of apparatuses, the occupation area of the processes in the factory can be reduced. Therefore, a substantial cost reduction can be achieved.

According to the IC mounting tape of an embodiment, a film-like substrate which has a flexibility and extends in one direction is provided, and IC chips are mounted on the substrate surface in one or a plurality of lines in the lengthwise direction of the substrate.

With the above-mentioned arrangement, the tape can be easily manufactured automatically continuously. In other words, a connection material for connecting the output side wiring line and the input side wiring line respectively with the output side electrode and the input side electrode of each IC chip, a connection material provided on the output side wiring line and the input side wiring line for the connection thereof with external electrodes, and members such as IC chips can be continuously supplied onto the film-like substrate. The above-mentioned process can be easily automated. Consequently, an increased productivity can be achieved to allow the manufacturing cost to be reduced in comparison with the case where flexible wiring boards are manufactured individually.

Furthermore, according to an embodiment, a through hole having plane dimensions smaller than the plane dimensions of the IC chip is provided in the area which belongs to the substrate surface of the flexible wiring board and in which the IC chip is mounted, while portions which belong respectively to the output side wiring line and the input side wiring line and are connected respectively with the output side electrode and the input side electrode of the IC chip are supported by the substrate surface around the through hole.

In the above-mentioned case, the portions do not bend in the process of mounting the IC chip or other manufacturing processes such as a winding process. Therefore, the amount of protrusion from the substrate surface of the output side wiring line and the input side wiring line can be reduced (the thickness of each wiring line is made thin) further than in the prior art. The amount of protrusion can be set to, for example, $1.8 \times 10^{-2}$ mm or less. When the amount of protrusion is set to such a reduced value, the output side wiring line and the input side wiring line are finished with high etching accuracy. Therefore, connection of the output side wiring line and the input side wiring line respectively with the output side electrode and the input side electrode of the IC chip is achieved at a pitch finer than in the prior art. Furthermore, connection of the output side wiring line and the input side wiring line with external panels of various sorts and the like is also achieved at a fine pitch.

Furthermore, a through hole is formed in the area in which the IC chip is mounted, whereby a superfluous substrate portion is removed. Therefore, the possible misalignment between the electrodes of the IC chip and the output side wiring line and the input side wiring line due to the influence of the thermal expansion of the substrate material in the process of mounting the IC chip by thermocompression bonding is reduced, so that the connection reliability is improved. Furthermore, the residual stress of the substrate is also reduced, and therefore the reliability of connection between the mutually opposite terminals is further improved. It is to be noted that the residual stress is reduced because of the reduction of the material by virtue of the provision of the through hole and the reduction in temperature of heating due to the reduction in required thermal capacity in the thermocompression bonding process.

Furthermore, for example, by extending in a specified pattern a part of the wiring layer from on the substrate surface around the through hole to the inside of the through hole in the area of the through hole at the substrate surface, an alignment mark corresponding to the IC chip is provided. In the above-mentioned case, an alignment mark is also provided at the IC chip, and alignment is achieved by observing both the alignment marks through the above-mentioned through hole. Accordingly, there is no need to perform the positional alignment with the complicated system as in the prior art, thereby allowing the fine-pitch terminals to be aligned with each other with high accuracy.

According to the IC mounting tape of an embodiment, one or a plurality of the connection materials are belt-shaped and provided in the lengthwise direction of the substrate, each connection material corresponding to at least one line of the IC chips.

With the above-mentioned arrangement, the connection material can be continuously supplied in the lengthwise direction of the substrate in the manufacturing process. Therefore, an increased productivity can be achieved to allow the manufacturing cost to be reduced in comparison with the case where the connection material is supplied to each individual flexible wiring board.

According to the IC mounting tape of an embodiment, a terminal connected to the output side wiring line or the input side wiring line is provided outside the area in which the belt-shaped connection material is provided on the substrate surface.

With the above-mentioned arrangement, by using the terminal as an inspection terminal and putting a probe pin for electrical inspection in contact with the terminal (inspection terminal), a function test of the IC chip and a connection test of the connection portions are performed in the middle of the assembling process. When a defective component is extracted as a result of each test, removal or rework is performed in early stages. Therefore, the manufacturing cost can be totally reduced.

According to the IC mounting tape of one embodiment, the output side wiring line, the input side wiring line, and the belt-shaped connection material are provided on one surface of the substrate, while a terminal connected to the output side wiring line or the input side wiring line is provided on the substrate surface opposite from the above-mentioned one substrate surface.

In the above-mentioned case, the terminal can be provided compactly on the rear side of the output side wiring line and the input side wiring line without increasing the area of the substrate nor accompanying cost increase. By using the terminal as an inspection terminal and putting a probe pin for electrical inspection in contact with the terminal (inspection terminal), a function test of the IC chip and a connection test of the connection portions are performed in the middle of the assembling process. When a defective component is extracted as a result of each test, removal or rework can be performed in early stages. Therefore, the manufacturing cost can be totally reduced. Furthermore, after the substrate is divided into individual flexible wiring boards, the above-mentioned terminal can be used as an inspection terminal with the board connected to any of various external panels and the like. In other words, a panel of each sort can be compactly assembled with provision of the inspection terminal.

According to the IC mounting tape manufacturing method of the present invention, the substrate and the one or the plurality of belt-shaped connection materials are fed in a stack in the lengthwise direction thereof onto a specified stage, and then subjected to a heating or pressure applying process, or a heating and pressure applying process on the stage, so that the substrate and the belt-shaped connection material are integrated continuously in the lengthwise direction.

According to the manufacturing method having the above-mentioned arrangement, the connection material is supplied in a short time in the lengthwise direction of the substrate. Therefore, an increased productivity can be achieved to allow the manufacturing cost to be reduced in comparison with the case where the connection material is supplied to each individual flexible wiring board.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The present invention will be described in detail below.

Figure 1:
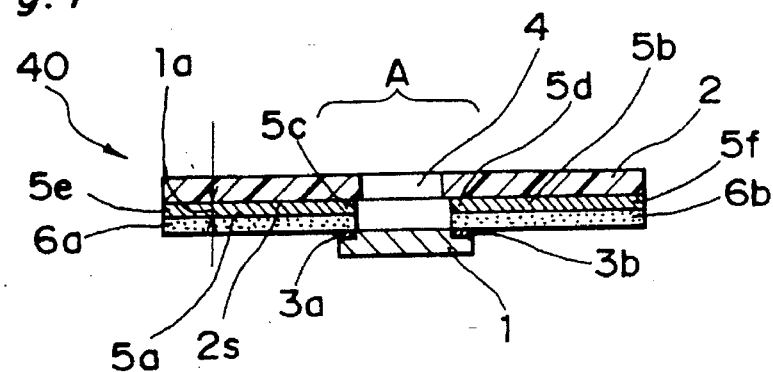
FIG. 1 is a view of an exemplified flexible wiring board for use in constructing a panel assembly structure of the present invention.

FIG. 1 shows a flexible wiring board 40 for use in constructing a panel assembly structure of an embodiment of the present invention. The flexible wiring board 40 has a film-like substrate 2 having a flexibility.

The substrate 2 is made of polyimide, polyester, or a bendable metal foil processed with an insulating film, or the like. In an area A at an appropriate center portion of a substrate surface 2s is mounted a drive IC 1 which serves as an IC chip having an output side electrode 3a and an input side electrode 3b. In the area A of the substrate surface 2s is provided a slit 4 which is a through hole having dimensions set smaller than the length and width dimensions of the drive IC 1. Around the slit 4 of the substrate surface 2s are provided an output side wiring line 5a and an input side wiring line 5b comprised of an identical wiring layer 5 (refer to FIG. 4). The output side wiring line 5a and the input side wiring line 5b are each made of Cu, Al or the like plated with Au or Sn, and an amount of protrusion 1a from the substrate surface 2s is set to $1.8 \times 10^{-2}$ mm or less (note that the output side wiring line 5a and the input side wiring line 5b may be buried in the substrate 2 and the amount of protrusion 1a from the substrate surface 2s may be zero or negative). Portions which belong respectively to the output side wiring line 5a and the input side wiring line 5b and are located at peripheral portions of the substrate surface 2s serve respectively as an output terminal 5e and an input terminal 5f of the flexible wiring board 40.

The output side electrode 3a and the input side electrode 3b of the drive IC 1 are connected respectively with the output side wiring line 5a and the input side wiring line 5b provided on the substrate surface 2s respectively via anisotropic conductive films 6a and 6b which serve as a second connection material. Portions 5c and 5d which belong respectively to the output side wiring line 5a and the input side wiring line 5b and are connected respectively with the output side electrode 3a and the input side electrode 3b of the drive IC 1 are supported by the substrate surface 2s around the slit 4.

Figure 3:
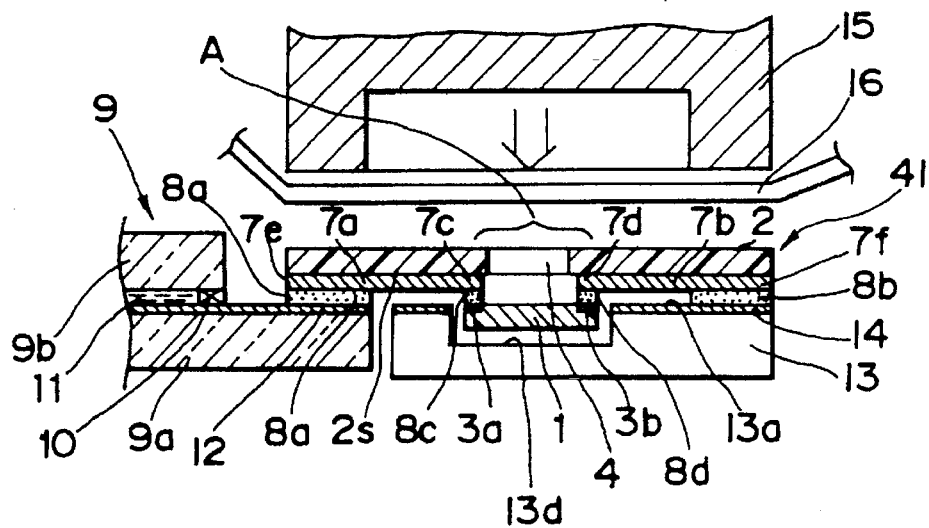
FIG. 3 is a view showing a panel assembly structure and an assembling process of an embodiment of the present invention.

It is also acceptable to adopt a connection material different from the anisotropic conductive films 6a and 6b as the second connection material, however, the material of anisotropic conductive film is sometimes preferable for the reason that the manufacturing cost can be reduced or other reasons. When the second connection material is provided by the anisotropic conductive films 6a and 6b, various sorts of terminal materials can be selected for the connection in comparison with the case where solder or another material is used. For instance, an inexpensive material of aluminum or the like can be selected as a material for the output side wiring line 5a and the input side wiring line 5b, and consequently a reduced cost can be achieved. Furthermore, as shown in FIG. 3, by adopting the anisotropic conductive films 6a and 6b as the first, second, and third connection materials, the connection materials can be provided by a connection material of an identical sort. It is preferable that the output side connection material 6a and the input side connection material 6b are made of a material of an identical sort, however, when a connection resistance and other specifications on the input side and the output side differ from each other, materials of different sorts or materials of different types and an identical sort are used at need.

Figure 2:
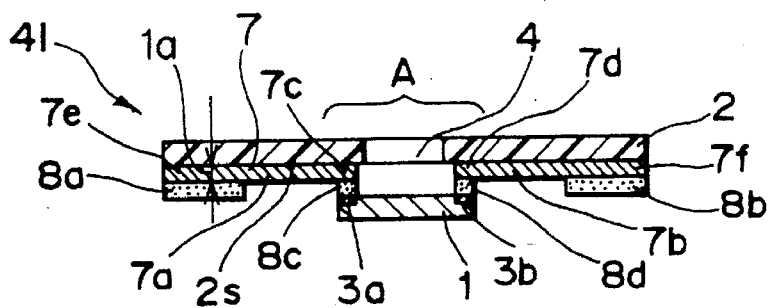
FIG. 2 is a view of an exemplified flexible wiring board for use in constructing a panel assembly structure of the present invention.

FIG. 2 shows a modification example 41 of the flexible wiring board 40. The flexible wiring board 41 has a substrate having the same structure as that of the substrate 2 of the flexible wiring board 40 (for simplicity, the substrate of the modification is denoted by the same reference numeral 2).

In an area A of a substrate surface 2s is mounted a drive IC 1 which serves as an IC chip having an output side electrode 3a and an input side electrode 3b. Around a slit 4 of the substrate surface 2s are provided an output side wiring line 7a and an input side wiring line 7b comprised of an identical wiring layer 7. The output side wiring line 7a and the input side wiring line 7b are each made of Cu, Al or the like plated with Au or Sn, and an amount of protrusion 1a from the substrate surface 2s is set to $1.8 \times 10^{-2}$ mm or less. Portions which belong respectively to the output side wiring line 7a and the input side wiring line 7b and are located at peripheral portions of the substrate surface 2s serve respectively as an output terminal 7e and an input terminal 7f of the flexible wiring board 41.

At the portions of the output terminal 7e and the input terminal 7f of the flexible wiring board 41, connection materials 8a and 8b of an identical sort are provided in the present example. It is to be noted that the connection materials 8a and 8b may be of different sorts, when the materials are required to be properly selected so as to be connectable in an identical connection condition (heating under pressure, heating, photo-setting under pressure, pressure welding, etc.).

The output side electrode 3a and the input side electrode 3b of the drive IC 1 are connected respectively with the output side wiring line 7a and the input side wiring line 7b provided on the substrate surface 2s respectively via second connection materials 8c and 8d. Portions 7c and 7d which belong respectively to the output side wiring line 7a and the input side wiring line 7b and are connected respectively to the output side electrode 3a and the input side electrode 3b of the drive IC 1 are supported by the substrate surface 2s around the slit 4.

In the present embodiment, the second connection materials 8c and 8d are provided by solder. Since the material is solder, the second connection materials 8c and 8d can be supplied to drive ICs in a wafer state before the wafer is divided into individual drive ICs. When the second connection materials 8c and 8d are supplied to the drive ICs in the wafer state, the materials can be supplied at a lower cost than when they are supplied to each one in a chip state. Furthermore, rework (restoration of defective components) can be facilitated after each drive IC 1 is mounted on the substrate surface, consequently allowing the manufacturing cost to be reduced. It is to be noted that the second connection materials 8c and 8d may be made of Au or Cu plated with Au preparatorily formed on each drive IC 1 or on the output side wiring line 7a and the input side wiring line 7b.

FIG. 3 shows a state in which an LCD panel 9 is assembled with the flexible wiring board 41 shown in FIG. 2. The LCD panel 9 is constituted by sealingly filling liquid crystals 11 in a space between mutually opposite substrates 9a and 9b. On an internal surface of the substrate 9a is formed an electrode terminal 12 for receiving a display signal from the flexible wiring board 41. In the vicinity of the LCD panel 9 is disposed a wiring board 13. One surface 13a of the wiring board 13 is formed with an electrode terminal 14 for supplying an input signal to the flexible wiring board 41 and with a recess portion 13d for storing the drive IC 1. By storing the drive IC 1 in the recess portion 13d, the resulting device thickness in the state of assembly can be reduced.

The assembling process is performed by connecting the output terminal 7e of the flexible wiring board 41 to the electrode terminal 12 of the LCD panel 9 via the first connection material 8a, and connecting the input terminal 7f of the flexible wiring board 41 to the electrode terminal 14 of the wiring board 13 via the third connection material 8b. In the connecting process, as shown in FIG. 3, the portions of the first connection terminal 7e and the third connection terminal 7f are simultaneously collectively connected via a sheet-like buffer material 16 by means of a concave type (or flat type) heating and pressure applying head 15. Through the above-mentioned processes, a reduced manufacturing cost and a stabilized quality can be achieved. The buffer material 16 is used for the reason that the heating and pressure applying head 15 has two or more pressure applying portions and therefore it is required to absorb deviations in parallelism or flatness of the pressure applying portions of the heating and pressure applying head 15. The buffer material 16 may be made of silicone rubber, polytetrafluoroethylene (PTFE), tetrafluoroethylene or a similar material having a thickness of about $0.5 \times 10^{-1}$ to 0.8 mm. With the above-mentioned arrangement, good releasability and good restorability result after the pressure-connecting process, consequently allowing a good connection reliability to be assured after it is used a plurality of times of about 100 to 10000 times.

When the first connection terminal 7e and the third connection terminal 7f have different specifications of connection resistance and the like, it is of course acceptable to use connection materials of different sorts or materials of different types and an identical sort as the first connection material 8a and the third connection material 8b.

According to the above-mentioned panel assembly structure, the portions 7c and 7d which belong respectively to the output side wiring line 7a and the input side wiring line 7b of the flexible wiring board 41 and are connected respectively with the output side electrode 3a and the input side electrode 3b of the drive IC 1 are supported by the substrate surface 2s around the slit 4. Therefore, the portions 7c and 7d can be prevented from being bent in a process of mounting the drive IC or other manufacturing processes. Therefore, the amount of protrusion 1b from the substrate surface 2s of the output side wiring line 7a and the input side wiring line 7b of the flexible wiring board 41 can be set to $1.8 \times 10^{-2}$ mm or less for the reasons as described above, i.e., the amount of protrusion can be reduced further than in the prior art. When the amount of protrusion 1a is set to such a reduced value, the output side Wiring line 7a and the input side wiring line 7b can be finished with high etching accuracy. Therefore, connection of the output side wiring line 7a and the input side wiring line 7b respectively with the output side electrode 3a and the input side electrode 3b of the drive IC 1 can be performed at a pitch finer than in the prior art. Furthermore, connection of the output terminal 7e comprised of a part of the output side wiring line 7a with the electrode terminal 12 of the LCD panel 9 and connection of the input terminal 7f comprised of a part of the input side wiring line 7b with the electrode terminal 14 of the wiring board 13 can be also performed at a fine pitch.

On the other hand, the slit 4 is formed in the area A in which the drive IC 1 is mounted on the substrate surface, whereby a superfluous substrate portion is removed. Therefore, the possible misalignment between the electrodes 3a and 3b of the drive IC 1 and the terminals 7c and 7d of the wiring lines 7a and 7b due to the influence of the thermal expansion of the substrate 2 in the process of mounting the drive IC 1 by thermocompression bonding can be reduced. Therefore, the connection reliability can be improved. Furthermore, the residual stress of the substrate 2 can be also reduced, and therefore the reliability of connection between the mutually opposite terminals can be further improved. It is to be noted that the residual stress is reduced because of a reduction of the stress itself due to the reduction of the material of the substrate 2 and a reduction in temperature of heating as a result of a reduction in thermal capacity in the thermocompression bonding process.

Figure 4:
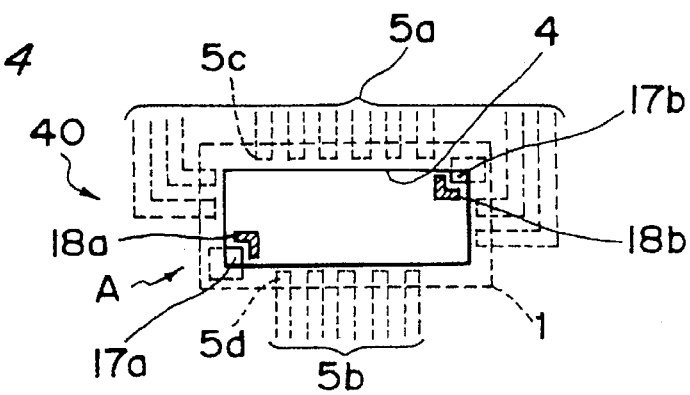
FIG. 4 is an enlarged view of an essential part of the flexible wiring board shown in FIG. 1.

FIG. 4 shows an example in which alignment marks 17a and 17b are provided in the area A of the flexible wiring board 40 shown in FIG. 1 (viewed perpendicularly to the substrate surface). At diagonally opposite corners of the slit 4, a pair of rectangular alignment marks 17a and 17b are provided while protruding into the slit 4 from the substrate surface side. On the other hand, the drive IC 1 is provided with L-shaped alignment marks 18a and 18b in portions corresponding to the alignment marks 17a and 17b of the flexible wiring board 40. When the alignment marks 17a, 17b, 18a, 18b are provided in a manner as described above, there is no need to perform the positional alignment with the complicated system as described with reference to FIG. 21, therefore allowing the fine-pitch terminals to be aligned with each other with high accuracy. In other words, the drive IC 1 and the flexible wiring board 40 can be aligned with each other with high accuracy automatically or semiautomatically while observing the alignment marks 17a, 17b, 18a and 18b through the slit 4. Therefore, the electrodes and terminals at the connection portions can be made to have a fine pitch, thereby allowing a high-density assembling to be achieved.

Figure 5:
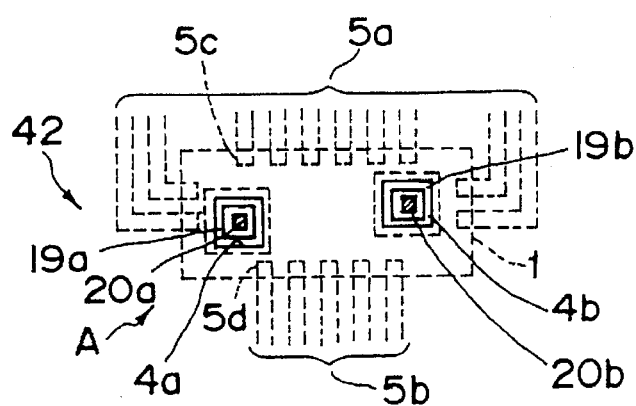
FIG. 5 is an enlarged view of an essential part of a modification example of the flexible wiring board shown in FIG. 4.

FIG. 5 shows an example in which a flexible wiring board 42 is provided with another slit and alignment marks. The flexible wiring board 42 is provided with a pair of rectangular slits 4a and 4b which serves as through holes in an area A of its substrate surface. Around the slits 4a and 4b are provided square or rectangular alignment marks 19a and 19b while protruding into the slits 4a and 4b from the substrate surface side. On the other hand, the drive IC 1 is provided with square or rectangular alignment marks 20a and 20b in portions corresponding to the alignment marks 19a and 19b of the flexible wiring board 42. When the alignment marks 19a, 19b, 20a, 20b are provided in a manner as described above, the drive IC and the flexible wiring board 42 can be aligned with each other with high accuracy automatically or semiautomatically while observing the alignment marks 19a, 19b, 20a and 20b through the slits 4a and 4b in the same manner as in the previous case. Therefore, the electrodes and terminals at the connection portions can be made to have a fine pitch, thereby allowing a high-density assembling to be achieved.

When the slits 4a and 4b are small as described above, as shown in FIG. 6, a thickness ta of a portion 2a in the area A in which the drive IC 1 is to be mounted at the substrate 2 of the flexible wiring board 42 is preferably set smaller than an original thickness tb.

Figure 6:
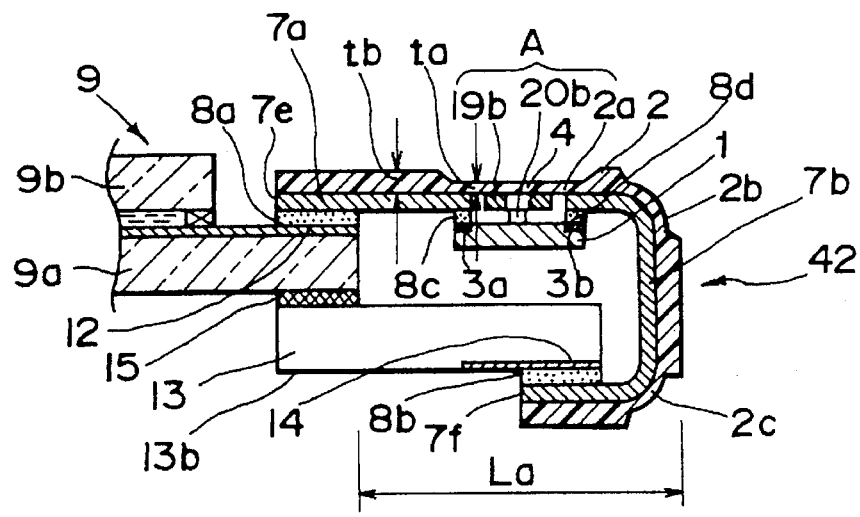
FIG. 6 is a view showing a panel assembly structure of an embodiment of the present invention.

FIG. 6 shows an example in which the LCD panel 9 is assembled with the flexible wiring board 42 shown in FIG. 5. The thickness ta of a portion 2a in the area A in which the drive IC 1 is mounted on the substrate 2 of the flexible wiring board 42 is set to a value two-thirds of the original thickness tb or less (for example, when the original thickness tb is $7.5 \times 10^{-2}$ mm, the thickness of the portion 2a in the area A is set to $3.5 \times 10^{-2}$ mm). When the thickness ta of the portion 2a in the area A is thin as described above, the drive IC 1 can be directly connected via a bump electrode serving as the second connection materials 8c and 8d and made of a material such as Au instead of solder. The above is because a difference in temperature distribution can be reduced in a direction of thickness of the portions in the connecting process and therefore the temperature of heating can be set low. When the temperature of heating is set low, even if a difference in coefficient of thermal expansion exists between the panel 9 and the flexible wiring board 42 connected with each other or between the drive IC 1 and the flexible wiring board 42 connected with each other, the residual stress due to the difference in coefficient of thermal expansion can be reduced after the connecting process. Furthermore, since the thickness of the substrate 2 of the flexible wiring board 42 is thin, the total amount of residual stress can be also reduced. Therefore, the reliability of the connection portions can be improved.

Furthermore, the thicknesses of the portions 2b and 2c which belong to the substrate 2 and are to be bent in the assembling process are set thinner than the original thickness tb in the same manner as in the portion 2a in the area A.

As a method for partially reducing the thickness of the substrate 2, there are known a method for performing etching by chemically reverse sputtering, by laser or the like and a method for supplying a substrate thinly after formation of a slit. By any of the above-mentioned methods, the thicknesses of the portions 2a, 2b and 2c of the substrate 2 can be set with high accuracy. Furthermore, by simultaneously performing setting of the thicknesses of the portions 2a, 2b and 2c, an excessive cost increase can be suppressed.

To make thin the entire substrate 2 of the flexible wiring board 42 results in a difficulty in manufacturing the substrate 2 itself and a difficulty in handling the substrate 2 in the mounting process of the drive IC 1 and other processes. The above-mentioned drawbacks disadvantageously result in a cost increase.

At a peripheral portion of the LCD panel 9, the wiring board 13 is integratedly assembled with the LCD panel 9 by means of a connection material 15. On a surface 13b which belongs to the wiring board 13 and is positioned opposite from the drive IC 1, there is formed an electrode terminal 14 for supplying an input signal to the flexible wiring board 42.

The assembling is performed by connecting the output terminal 7e of the flexible wiring board 42 to the electrode terminal 12 of the LCD panel 9 via the first connection material 8a, bending the flexible wiring board 42 at the portions 2b and 2c having small thicknesses, and connecting the input terminal 7f of the flexible wiring board 42 to the electrode terminal 14 of the wiring board 13 via the third connection material 8b. In the process of positional alignment, while observing the alignment marks 19a and 19b or the alignment marks 20a and 20b (only the marks 19a and 20b are shown in FIG. 6) together with alignment marks (not shown) of the LCD panel 9 through the slits 4a and 4b, the LCD panel 9 and the flexible wiring board 42 can be aligned with each other automatically or semiautomatically with high accuracy. Therefore, the electrodes and terminals at the connection portions can be made to have a fine pitch, thereby allowing a high-density assembling to be achieved.

When the assembly structure in which the flexible wiring board 42 is bent in an approximately U-like form as shown in FIG. 6 is adopted, a dimension of protrusion La protruding sidewise from an edge of the LCD panel 9 can be reduced, thereby allowing a compact assembly structure to be obtained. Furthermore, the thicknesses of the bent portions 2b and 2c of the substrate 2 of the flexible wiring board 42 are set thin as in the portion 2a in the area A, and therefore the portions 2b and 2c can be easily processed to be bent, thereby allowing a reduced residual stress to be achieved after the bending process. Therefore, the reliability of the connection portions of the output terminal 7e and the input terminal 7f can be improved.

Figure 7:
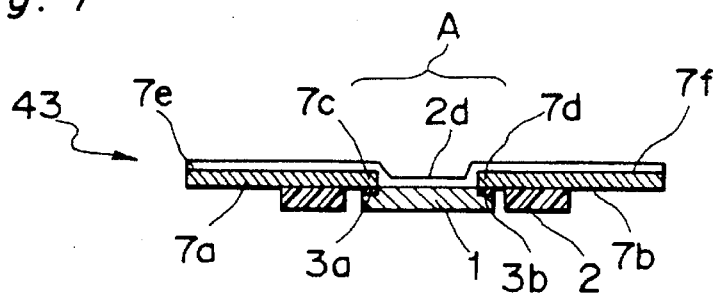
FIG. 7 is a view of an exemplified flexible wiring board for use in constructing a panel assembly structure of the present invention.

FIG. 7 shows a flexible wiring board 43 in which the thickness of a substrate 2 is set thin and a resin layer 2d which is thinner than the substrate 2 and has a flexibility is provided at least in an area A in which a drive IC 1 is to be provided.

The resin layer 2d is formed of a material identical to or different from the material of the original substrate 2. The resin layer 2d can be formed before or after the drive IC 1 is mounted after a pattern formation of the output side wiring line 7a and the input side wiring line 7b is completed on the substrate 2 surface. When the resin layer 2d is provided by a photo-setting resin or another material, the layer may be formed simultaneously with the assembling while concurrently serving as the second connection material.

The resin layer 2d may be formed on the entire surface of the substrate 2 as shown in FIG. 7. In particular, the resin layer 2d is preferably formed in the vicinity of the output terminal 7e and the input terminal 7f. When the resin layer 2d is formed in the vicinity of the output terminal 7e and the input terminal 7f, the following advantages are produced. (1) Since the output terminal 7e and the input terminal 7f are retained with high accuracy, there is less possibility of the occurrence of imperfect connection due to a contact thereof with a foreign object in the manufacturing process or in handling thereof even if the terminals 7e and 7f have a fine-pitch configuration. (2) Particularly when the first and third connection materials are anisotropic conductive films, the output terminal 7e and the input terminal 7f have an improved adhesive strength. (3) When connection is performed under pressure by means of the pressure head 15 as shown in FIG. 3, a variation in flatness or parallelism of the pressure head 15 can be absorbed to some extent by a buffering effect. Still the thickness of the resin layer 2d is smaller than the original thickness of the substrate 2, and therefore a reduced capacity of heating can be permitted. Therefore, (4) when the connection is performed by heating under pressure in a manner as shown in FIG. 3, the temperature of the pressure head 15 can be reduced so that the variation in temperature distribution can be reduced in the connecting process, thereby allowing uniform terminal connection to be achieved. Further, (5) by performing the connection by reducing the temperature of the pressure head 15, the residual stress which will be left in the resin layer 2d after the connecting process can be reduced, thereby allowing the total residual stress to be reduced. Therefore, the connection reliability can be improved.

It is to be noted that the same effect as above can be obtained by forming a thin resin layer 2d at the bent portions 2b and 2c of the substrate 2 as shown in FIG. 6.

Figure 8:
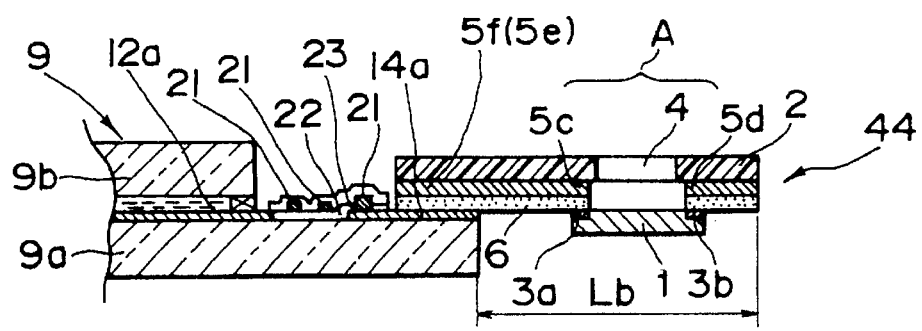
FIG. 8 is a view of a panel assembly structure of another embodiment of the present invention.

FIG. 8 shows a panel assembly structure of another embodiment. In the present embodiment, a wiring board for supplying an input signal to a flexible wiring board 44 is integratedly formed at a peripheral portion of the LCD panel 9. That is, the wiring board 13 provided separately in FIG. 3 or FIG. 6 are discarded, and a plurality of bus lines 21, 21 and 21 for supplying an input signal are formed at peripheral portions of one substrate 9a of the LCD panel 9. Among them, one bus line 21 is connected to a corresponding input signal junction electrode terminal 14a through a through hole 23 provided at an insulating film 22.

On the other hand, an area A which belongs to the flexible wiring board 44 and in which the drive IC 1 is mounted has quite the same structure as that of the flexible wiring board 40 shown in FIG. 1. At the flexible wiring board 44, an input terminal 5f is provided along the same side as that of the output terminal 5e.

When assembled, the peripheral portion of the LCD panel 9 and the side where the input terminal 5f and the output terminal 5e of the flexible wiring board 44 are provided are made to overlap each other with interposition of an anisotropic conductive film 6 which serves as the first, second and third connection materials, and then connected with each other by heating under pressure. The connection can be collectively performed by means of a pressure head smaller than the pressure head 15 shown in FIG. 3.

Through the above-mentioned processes, the input terminal 5f of the flexible wiring board 44 is connected with the electrode terminal 14a at the peripheral portion of the LCD panel 9. On the other hand, the output terminal 5e of the flexible wiring board 44 is connected with the original electrode terminal 12a of the LCD panel 9 in another sectional plane (not shown) parallel to the sectional plane shown in FIG. 8.

According to the above-mentioned assembly structure, the LCD panel 9 and the wiring board are integrated, and therefore the assembly body can be finished with light weight. Furthermore, in comparison with the assembly structure shown in FIG. 3, the amount of protrusion Lb toward a side of the LCD panel 9 can be reduced. Furthermore, connection on the output side and the input side of the flexible wiring board 44 can be simultaneously performed with one connecting apparatus. Therefore, the manufacturing processes can be reduced in number.

Furthermore, the apparatuses necessary for obtaining a specified throughput can be reduced in number, thereby allowing an investment cost for an equipment to be reduced. Furthermore, as a result of the reduction in number of apparatuses, the occupation area of the processes in a factory can be reduced. Therefore, a substantial cost reduction can be achieved.

Furthermore, the first, second and third connection materials are integratedly made of the anisotropic conductive film 6, and therefore the first, second and third connection material 6 are supplied to a normally rolled flexible wiring board simultaneously with one supply apparatus. Therefore, the manufacturing processes are reduced in number. Furthermore, the apparatuses necessary for obtaining a specified throughput can be reduced in number, thereby allowing an investment cost for the equipment to be reduced. Further, as a result of the reduction in number of apparatuses, the occupation area of the processes in the factory can be reduced. Therefore, a substantial cost reduction can be achieved.

Figure 9:
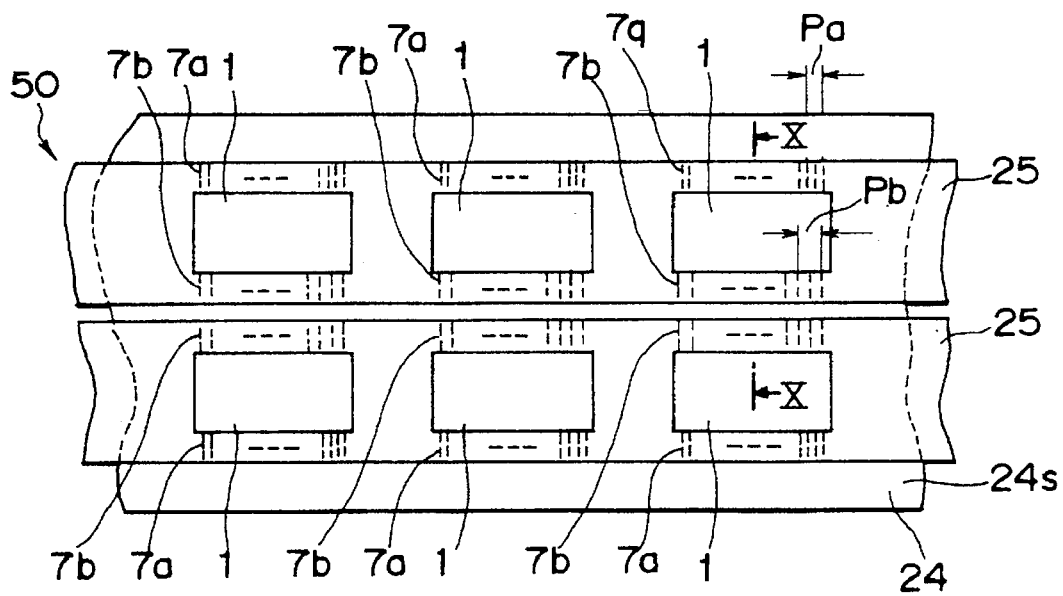
FIG. 9 is a view of an IC mounting tape of an embodiment of the present invention.
Figure 10:
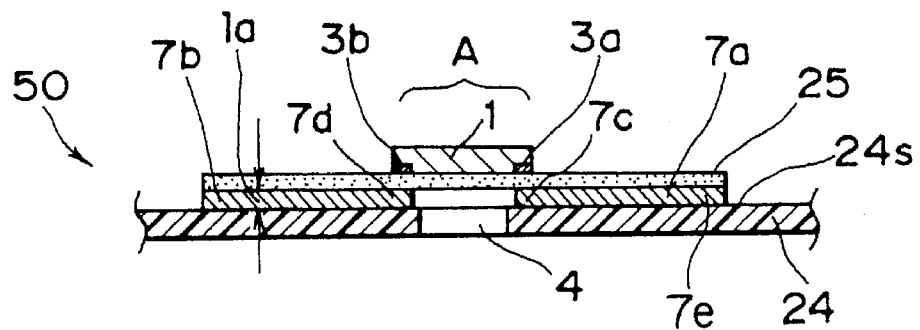
FIG. 10 is a sectional view taken along a line X—X in FIG. 9.

FIG. 9 shows an IC mounting tape 50 of an embodiment of the present invention, while FIG. 10 shows a section taken along a line X—X in FIG. 9.

As shown in FIG. 9, the IC mounting tape 50 has a film-like substrate 24 which has a flexibility and extends in one direction. In the lengthwise direction of the substrate 24, drive ICs 1 are mounted in two lines on a substrate surface 24s. On the substrate surface 24s are provided output side wiring lines 7a and input side wiring lines 7b for each drive IC 1. The output side wiring lines 7a and the input sides wiring lines 7b extend towards the side edges of the substrate 24 from mutually opposite sides of each drive IC 1. The output side wiring lines 7a are arranged at a pitch of Pa, while the input side wiring lines 7b are arranged at a pitch of Pb. Further, an anisotropic conductive film 25 is provided as a belt-shaped connection material for each line of the drive ICs 1. As shown in FIG. 10, an output side electrode 3a and an input side electrode 3b of each drive IC 1 are connected respectively with the output side wiring line 7a and the input side wiring line 7b via the anisotropic conductive film 25.

In an area A which belongs to the substrate surface 24s and in which each drive IC 1 is mounted, a slit 4 which serves as a through hole having dimensions smaller than the plane (length and width) dimensions of the drive IC 1 is provided. Portions 7c and 7d which belong respectively to the output side wiring line 7a and the input side wiring line 7b and are connected respectively with the output side electrode 3a and the input side electrode 3b of the drive IC 1 are supported by the substrate surface 24s around the slit 4.

The IC mounting tape 50 can be easily manufactured automatically continuously by continuously supplying numbers such as the belt-shaped anisotropic conductive film 25 and the drive ICs 1, 1, ... onto the substrate surface 24s of the film-like substrate 24. Then, by cutting the IC mounting tape 50 in positional correspondence with each of the drive ICs 1, i.e., between mutually adjacent drive ICs 1 and 1, a plurality of flexible wiring boards can be obtained at a time. Consequently, an increased productivity can be achieved to allow the manufacturing cost to be reduced in comparison with the case where a flexible wiring board is manufactured for each individual drive IC 1.

At the IC mounting tape 50, the portions 7c and 7d which belong respectively to the output side wiring line 7a and the input side wiring line 7b and are connected respectively with the output side electrode 3a and the input side electrode 3b of each drive IC 1 are supported by the substrate surface 24s around the slit 4. Therefore, the portions 7c and 7d can be prevented from being bent in a process of mounting the drive IC or other processes. Therefore, the amount of protrusion 1b from the substrate surface 24s of the output side wiring line 7a and the input side wiring line 7b can be set to, for example, $1.8 \times 10^{-2}$ mm or less, i.e., reduced further than in the prior art. When the amount of protrusion 1a is set to such a reduced value, the output side wiring line 7a and the input side wiring line 7b can be finished with high etching accuracy. Therefore, the pitches Pa and Pb of the output side wiring line 7a and the input side wiring line 7b can be reduced, and the connection of the output side wiring line 7a and the input side wiring line 7b with the output side electrode 3a and the input side electrode 3b of the drive IC 1 can be performed at a pitch finer than in the prior art. Furthermore, connection of the output terminal 7e comprised of a part of the output side wiring line 7a with an external panel or the like can be also performed at a fine pitch.

On the other hand, the slit 4 is formed in the area A in which the drive IC 1 is mounted at the substrate surface 24s, whereby a superfluous substrate portion is removed. Therefore, the possible misalignment between the electrodes 3a and 3b of the drive IC 1 and the terminals 7c and 7d on the wiring line side due to the influence of the thermal expansion of the substrate 2 in the process of mounting the drive IC 1 with thermocompression bonding can be reduced. Therefore, the connection reliability can be improved. Furthermore, the residual stress of the substrate 24 can be reduced, and therefore the reliability of connection between the mutually opposite terminals can be further improved. It is to be noted that the residual stress is reduced because of a reduction of the stress itself due to the reduction of the material of the substrate 24 and a reduction in temperature of heating as a result of a reduction in thermal capacity in the thermocompression bonding process.

Figure 21:
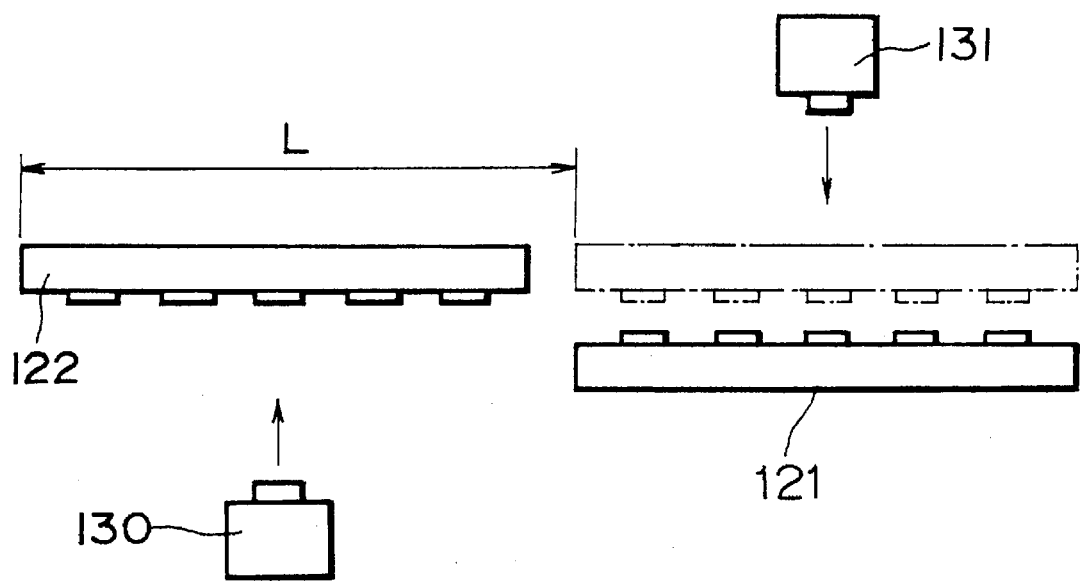
FIG. 21 is a view for explaining a method for aligning prior art boards.

In the area of the slit 4 at the substrate surface 24s, alignment marks 17a and 17b as shown in FIG. 4 are provided, and the drive IC 1 is provided with corresponding alignment marks 18a and 18b, thereby allowing positional alignment to be achieved by observing both the alignment marks 17a, 17b; 18a, 18b through the aforementioned through hole 4. With the above-mentioned arrangement, there is no need to perform the positional alignment with the complicated system as shown in FIG. 21, thereby allowing the fine-pitch terminals to be aligned with each other with high accuracy.

It is to be noted that drive ICs 1 may be arranged in three or more lines on the substrate surface 24s. Further, a plurality of belt-shaped anisotropic conductive films 25 may be provided for each line of the drive ICs 1.

Figure 11:
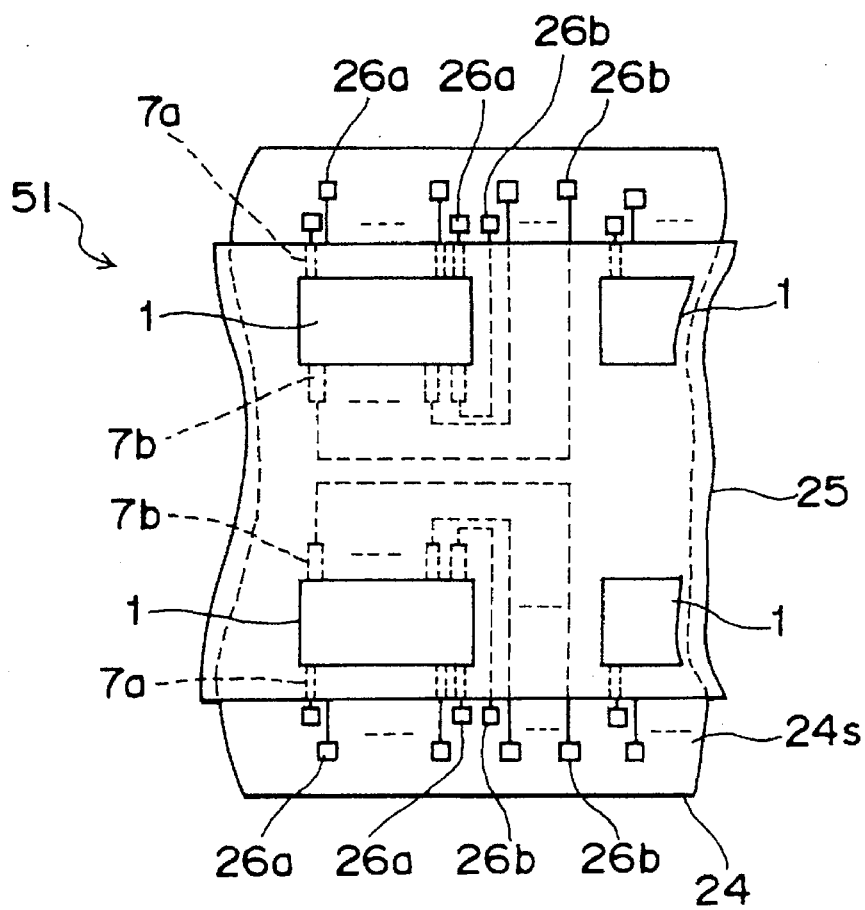
FIG. 11 is a view of an IC mounting tape of an embodiment of the present invention.

FIG. 11 shows another IC mounting tape 51.

The IC mounting tape 51 has a film-like substrate 24 which has a flexibility and extends in one direction. In the lengthwise direction of the substrate 24, drive ICs 1 are mounted in two lines on a substrate surface 24s. On the substrate surface 24s are provided output side wiring lines 7a and input side wiring lines 7b for each drive IC 1. The output side wiring line 7a extends from a side of the drive IC 1 toward a side edge of the substrate 24, and a terminal 26a is provided at a tip end of the output side wiring line 7a. On the other hand, the input side wiring line 7b extends as bent in a bracket shape from the opposite side of the drive IC 1 toward the side edge of the substrate 24, and a terminal 26b is provided at a tip end of the input side wiring line 7b. Further, in the lengthwise direction of the substrate 24, one anisotropic conductive film 25 is provided as a belt-shaped connection material over two lines of the drive ICs 1. The terminals 26a and 26b at the tip ends of the output side wiring line 7a and the input side wiring line 7b are arranged outside the area in which the anisotropic conductive film 25 is provided at the substrate surface 24s. Similarly to the one shown in FIG. 10, the output side electrode and the input side electrode of each drive IC 1 are connected respectively to the output side wiring line 7a and the input side wiring line 7b via the anisotropic conductive film 25.

At the IC mounting tape 51, one belt-shaped anisotropic conductive film 25 is provided for two lines of the drive ICs 1, and therefore the mounting processes can be reduced further in number than in the IC mounting tape 50 shown in FIG. 9.

Further, by using the terminals 26a and 26b as inspection terminals and putting probe pins for electrical inspection in contact with the inspection terminals 26a and 26b, a function test of the drive IC 1 and a connection test of the connection portions can be performed in the middle of the assembling process. When a defective component is extracted as a result of each test, removal or rework can be performed in early stages. Therefore, the manufacturing cost can be totally reduced.

Figure 12:
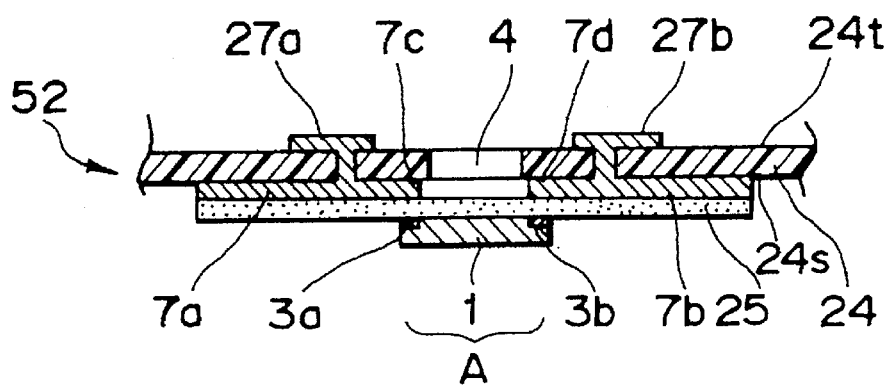
FIG. 12 is a view of an IC mounting tape of an embodiment of the present invention.

FIG. 12 shows yet another IC mounting tape 52. The IC mounting tape 52 is a modification of the IC mounting tape 50 shown in FIG. 9, and has in plane the same construction as that of the IC mounting tape 50 shown in FIG. 9. At the IC mounting tape 52, terminals 27a and 27b connected respectively with the output side wiring line 7a and the input side wiring line 7b are provided through the substrate 24 on a substrate surface 24t opposite to the substrate surface 24s on which the output side wiring line 7a, the input side wiring line 7b and the anisotropic conductive film 25 are provided. The terminals 27a and 27b can be provided compactly without increasing the area of the substrate surface 24s nor accompanying cost increase.

Further, by using the terminals 27a and 27b as inspection terminals and putting probe pins for electrical inspection in contact with the inspection terminals 27a and 27b, a function test of the IC chip and a connection test of the connection portions can be performed in the middle of the assembling process. When a defective component is extracted as a result of each test, removal or rework can be performed in early stages. Therefore, the manufacturing cost can be totally reduced. Further, after the substrate 24 is divided every drive IC 1 into individual flexible wiring boards, the terminals 27a and 27b can be used as inspection terminals with the boards connected to any of various external panels and the like. In other words, a panel of each sort can be compactly assembled with provision of the inspection terminals.

Figure 13:
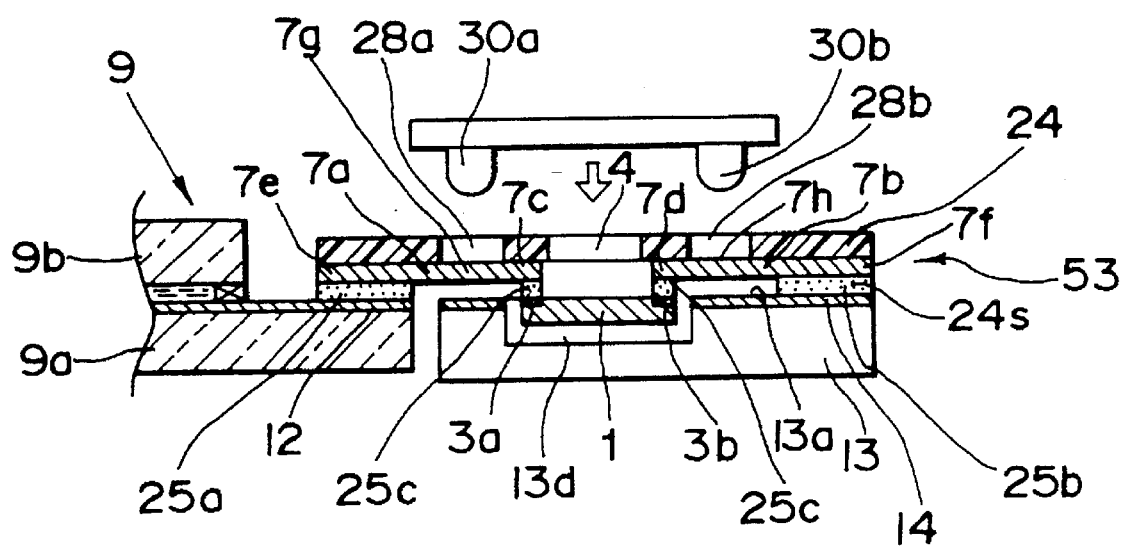
FIG. 13 is a view showing a panel assembly structure and an electric inspection method of an embodiment of the present invention.

FIG. 13 shows still another IC mounting tape 53. The IC mounting tape 53 is a modification of the IC mounting tape 50 shown in FIG. 9. The present IC mounting tape 53 has in plane a construction similar to that of the IC mounting tape 50 shown in FIG. 9 except that two belt-shaped anisotropic conductive films 25a and 25b and a solder connection material 25c are provided for each line of the drive ICs 1. The anisotropic conductive film 25a is provided at an output terminal 7e of an output side wiring line 7a, the anisotropic conductive film 25b is provided at an input terminal 7f of an input side wiring line 7b, and the solder connection material 25c is provided at portions 7c and 7d to be connected respectively with the electrodes 3a and 3b of each drive IC 1. Further, at the present IC mounting tape 53, portions which belong to the substrate surface 24s and correspond to parts of the output side wiring line 7a and the input side wiring line 7b are formed with slits 28a and 28b each penetrating a substrate 24. Portions 7g and 7h which belong respectively to the output side wiring line 7a and the input side wiring line 7b and are exposed due to the slits 28a and 28b are made to serve as terminals against which inspection probe pins 30a and 30b can abut.

According to the IC mounting tape 53, the wiring layers 7a and 7b are formed only on one surface 24s of the substrate 24, and therefore a further cost reduction than with the IC mounting tape 52 shown in FIG. 12 can be achieved. Furthermore, by using the terminals 7g and 7h as inspection terminals and putting probe pins 30a and 30b for electrical inspection in contact with the inspection terminals 7g and 7h in a manner similar to the IC mounting tape 52 shown in FIG. 12, a function test of the IC chip and a connection test of the connection portions can be performed in the middle of the assembling process. When a defective component is extracted as a result of each test, removal or rework can be performed in early stages. Therefore, the manufacturing cost can be totally reduced. Further, after the substrate 24 is divided every drive IC 1 into individual flexible wiring boards, the terminals 7g and 7h can be used as inspection terminals with the boards connected to any of various external panels and the like. In other words, a panel of each sort can be compactly assembled with provision of the inspection terminals.

Figure 14A:
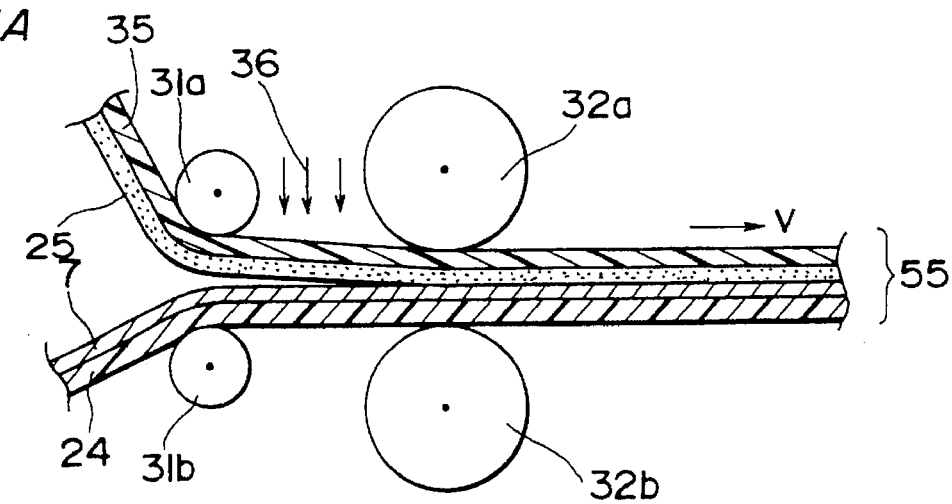
FIGS. 14A through 14C are views showing an IC mounting tape manufacturing process of an embodiment of the present invention.
Figure 14B:
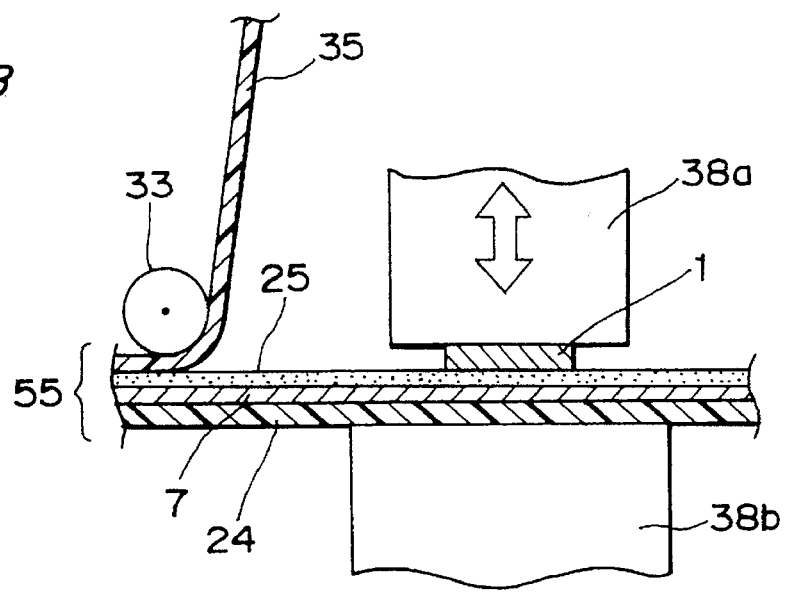
Figure 14C:
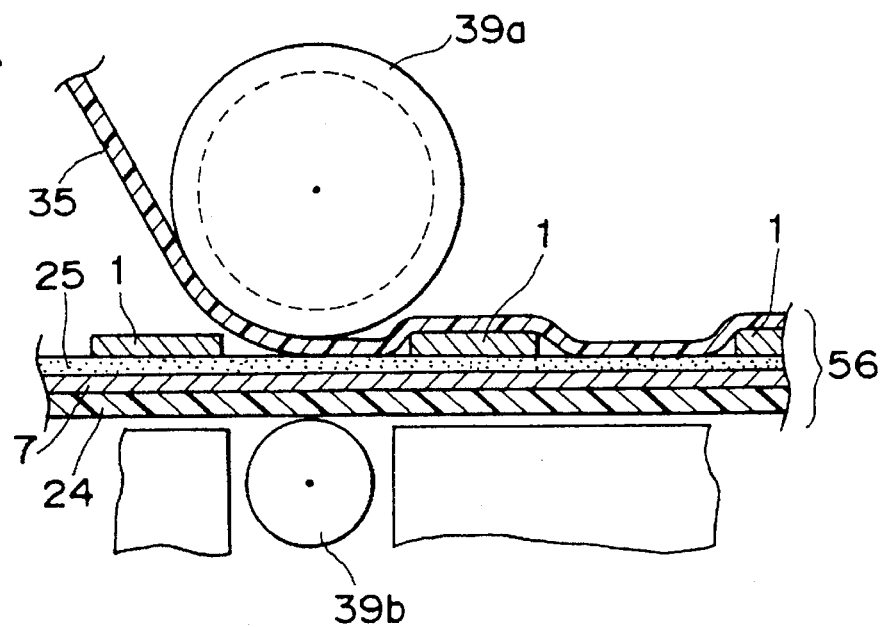

FIGS. 14A through 14C show a manufacturing process of an IC mounting tape provided with a protection film of an embodiment.

In FIG. 14A, there are shown a pair of upper and lower guide rollers 31a and 31b and a pair of pressure rollers 32a and 32b which serve as a stage.

A surface of a substrate 24 on a connection material 25 side is preparatorily provided with a wiring layer 7. On the other hand, one surface (surface that is not put in contact with the wiring layer 7) of the connection material 25 is provided with a protection film having appropriate cleanness, releasability, and thermal conductivity. The protection film 35 is made of, for example, a PTFE (polytetrafluoroethylene) material having a thickness of 0.1 mm or less, so that any foreign material can be prevented from being transferred onto the anisotropic conductive film 25 from the upper rollers 31a and 32a or the like.

(1) As shown in FIG. 14A, the film-like substrate 24 and a belt-shaped connection material 25 comprised of, for example, an anisotropic conductive film are made to pass in a stack between the guide rollers 31a and 31b in the lengthwise direction thereof at a constant velocity v.

(2) After making the substrate 24 and connection material 25 pass between the guide rollers 31a and 31b and before pressing them by means of the rollers 32a and 32b, a hot blast 36 is blown toward the connection material 25 from the protection film 35 side so as to heat the connection material 25 and so forth to a specified temperature.

It is to be noted that the means for heating the connection material 25 and so forth is not limited to the hot blast 36. A heater (not shown) may be provided inside the upper roller 32a so that the roller 32a has a surface temperature of about 200° C.

(3) The stack of the substrate 24, the connection material 25 and so on is continuously fed between the pressure rollers 32a and 32b at the velocity v. The stack is then integrated by applying a pressure by means of the pressure rollers 32a and 32b, so that a laminate 55 comprised substantially of four layers 35, 25, 7 and 24 is produced.

When the feed velocity v is set to a value not greater than 250 mm/min., a reduced number of bubbles are involved, so that the laminate 55 is stably manufactured.

When the upper roller 32a is provided by a roller formed by coating the surface of a metal core having a diameter of 100 mm or more with a coat of teflon or the like (not shown) by a thickness of 1 mm or less, an appropriate thermal uniformity is assured to scarcely incur imperfect adhesion of the connection material 32, and even if the connection material 25 protrudes out of the protection film 35, the connection material 25 does not stick to the surface of the upper roller 32a.

(4) Then, the protection film 35 is once peeled off via the guide roller 33 in a manner as shown in FIG. 14B. In the above-mentioned state, drive ICs 1 are successively mounted on the connection material 25 by a mounting head 38a on a mounting stage 38b.

(5) Then, by means of a pair of upper and lower rollers 39a and 39b, the protection film 35 is made to adhere again to the surface of the connection material 25 over the drive ICs 1 in a manner as shown in FIG. 14C. Thus an IC mounting tape 56 provided with a protection film is produced. The protection film 35 can protect fine-pitch terminal portions.

Since the substrate 24 and the belt-shaped connection material 25 and so forth are continuously integrated in the lengthwise direction, the connection material 25 can be supplied to the substrate 24 at a time. Therefore, the productivity can be increased to allow the manufacturing cost to be reduced in comparison with the case where the connection material is supplied to each individual flexible wiring board.

Figure 15:
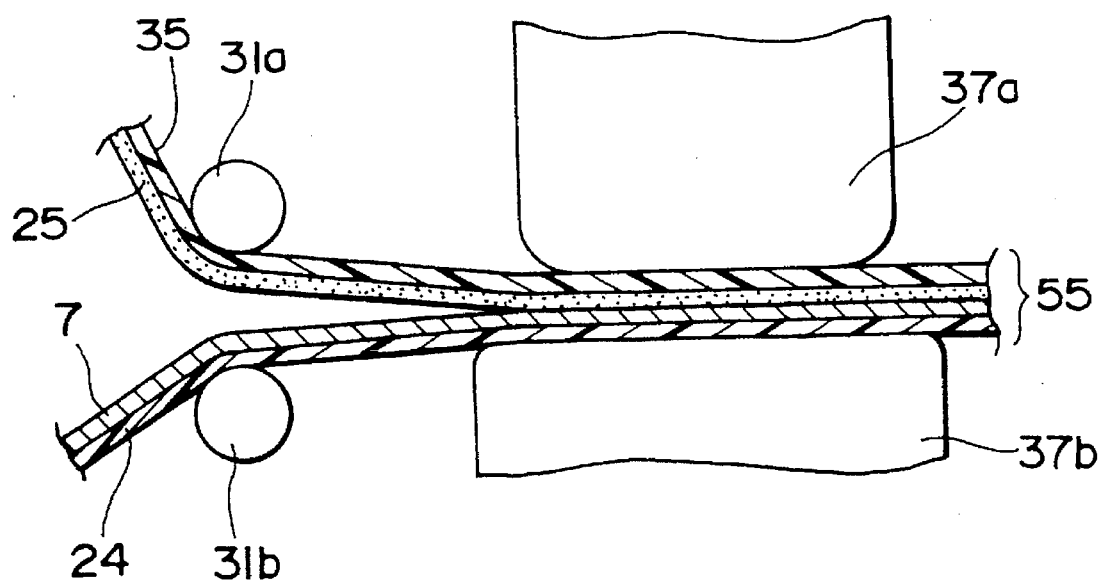
FIG. 15 is a view showing a modification example of a phase of the IC mounting tape manufacturing process shown in FIG. 14.
Figure 16:
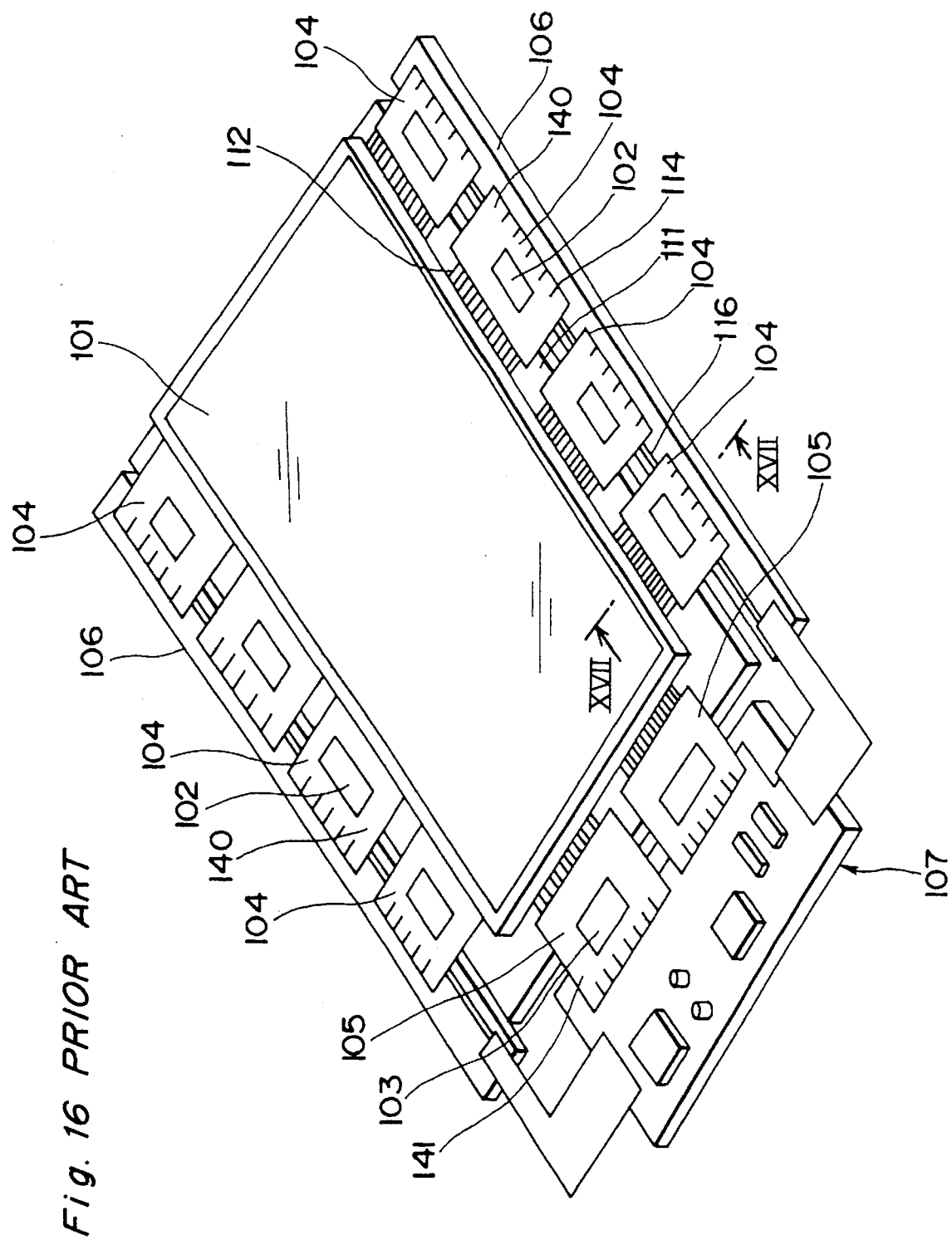
FIG. 16 is a perspective view of a prior art LCD device.
Figure 17:
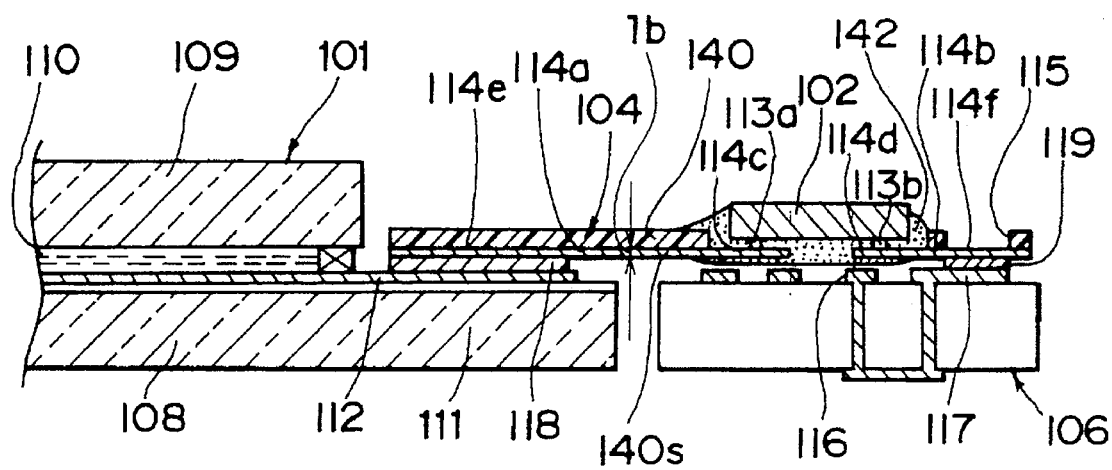
FIG. 17 is a sectional view taken along a line XVII—XVII in FIG. 16.
Figure 18:
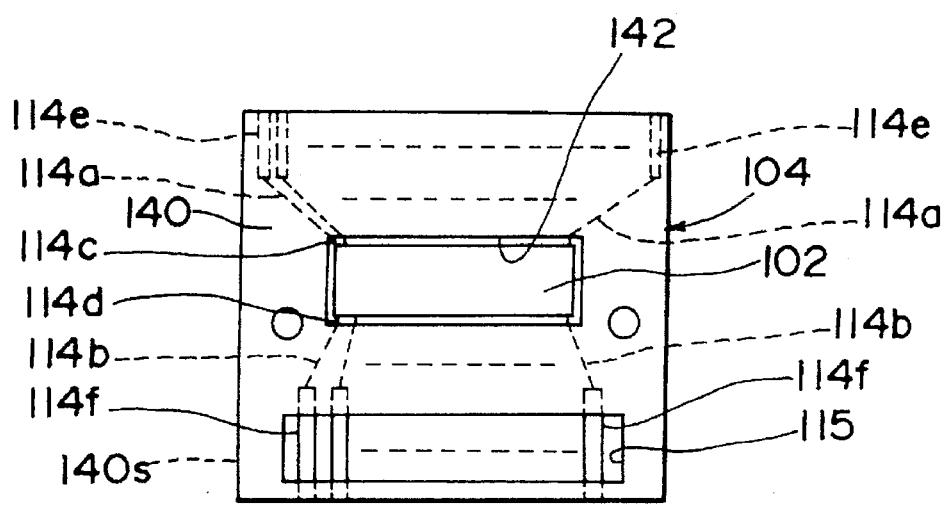
FIG. 18 is a view of a flexible wiring board for use in constructing the prior art LCD device.
Figure 19:
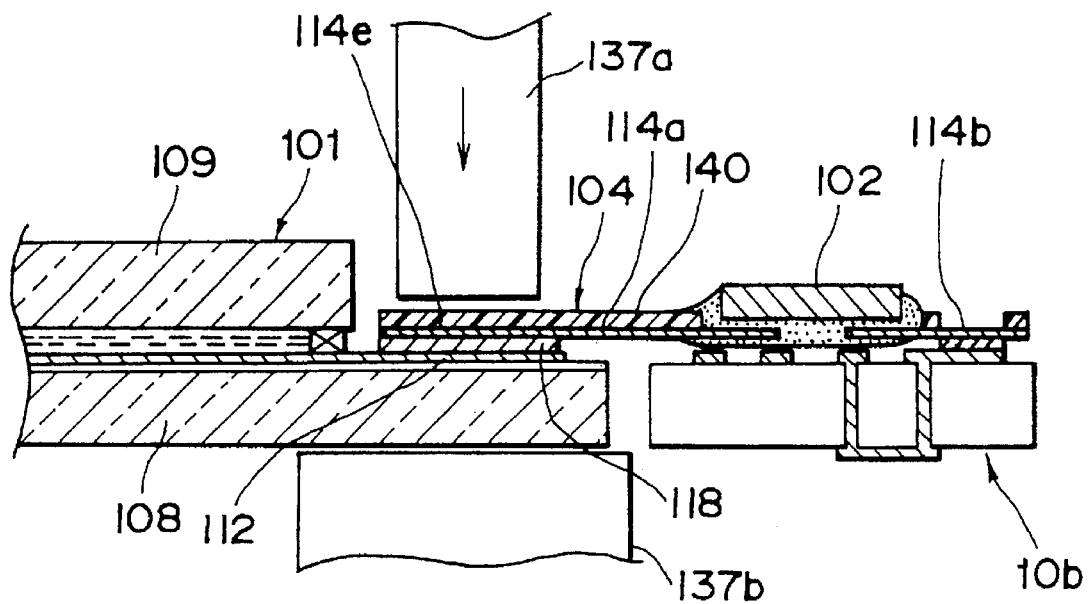
FIG. 19 is a view for explaining a method for mounting the prior art LCD device.
Figure 20:
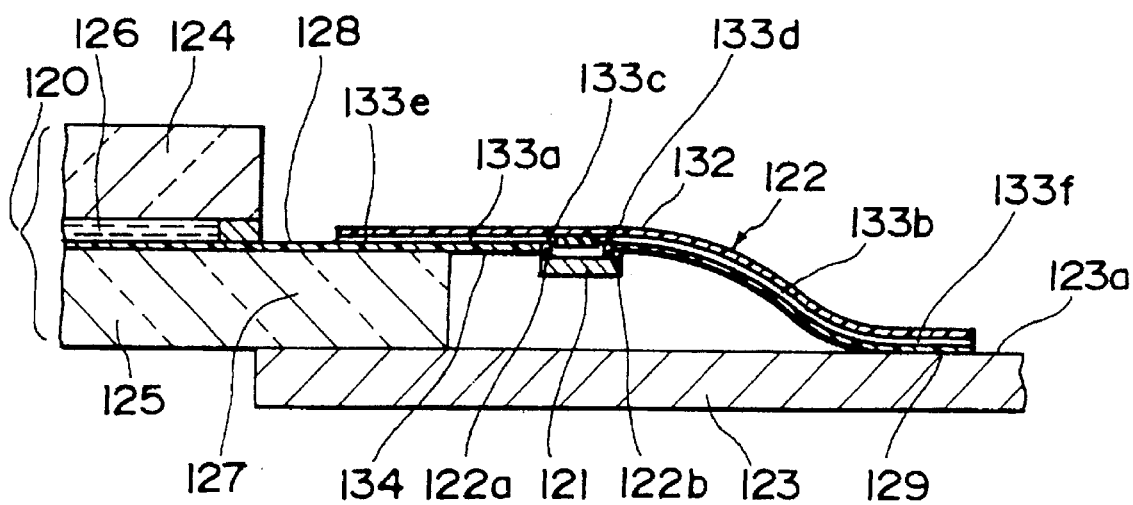
FIG. 20 is a view of another prior art LCD device.

FIG. 15 shows another process for manufacturing the laminate 55. The present process includes the following procedure.

(1) A film-like substrate 24 and a belt-shaped connection material 25 are made to pass between guide rollers 31a and 31b in a stack in the lengthwise direction thereof. They are fed intermittently at intervals of an integral multiple of the pitch of a flexible wiring board to be finally produced.

(2) While the feeding is stopped, the stack of the substrate 24, the connection material 25 and so forth is integrated by applying heat and pressure to the stack on a stage 37b by means of a head 37a coated with PTFE. Through the above-mentioned process, a laminate 55 comprised substantially of four layers 35, 25, 7 and 24 is produced.

When the pressure force of the head 37a is set within a range of 5 to 25 kg/cm$^2$, the laminate 55 can be stably manufactured.

It is to be noted that the wiring layer 7 is supported by the substrate 24 even though the wiring layer 7 has fine-pitch thin terminals and therefore no such defect as terminal break occurs. However, if the pressure force is set to 25 kg/cm$^2$ or more, edges of the terminals are possibly deformed (wire sagging) or the alignment marks are possibly deformed.

As apparent from the above description, according to the panel assembly structure of the present invention, a through hole having plane dimensions smaller than plane dimensions of a IC chip is provided in the area which belongs to a substrate surface of a flexible wiring board and are mounted with the IC chip. In addition, portions which belongs respectively to an output side wiring line and an input side wiring line and are connected respectively with an output side electrode and an input side electrode of the IC chip are supported by the substrate surface around the through hole. Therefore, the portions can be prevented from being bent in the process of mounting the IC chip or other manufacturing processes. Therefore, the amount of protrusion from the substrate surface of the output side wiring line and the input side wiring line of the flexible wiring board can be reduced (the thickness of the wiring layer is made thin) further than in the prior art. The amount of protrusion can be set to $1.8 \times 10^{-2}$ mm or less. When the amount of protrusion is set to such a reduced value, the output side wiring line and the input side wiring line can be finished with high etching accuracy. Therefore, connection of the output side wiring line and the input side wiring line respectively with the output side electrode and the input side electrode of the IC chip can be performed at a pitch finer than in the prior art. Furthermore, connection of an output terminal comprised of a part of the output side wiring line with an electrode terminal of a panel and connection of an input terminal comprised of a part of the input side wiring line with an electrode terminal of a wiring board can be also performed at a fine pitch.

On the other hand, the through hole is formed in the area in which the IC chip is mounted, whereby a superfluous substrate portion is removed. Therefore, the possible misalignment between the electrodes of the IC chip and the terminal portions of the wiring lines of the flexible wiring board due to the influence of thermal expansion of the substrate in the process of mounting the IC chip by thermocompression bonding is reduced. Therefore, an improved connection reliability is achieved. Furthermore, the residual stress of the substrate is also reduced, and therefore the reliability of connection between the mutually opposite terminals is further improved.

Furthermore, for example, by extending in a specified pattern a part of the wiring layer from on the substrate surface around the through hole to the inside of the through hole in the area of the through hole at the substrate surface of the flexible wiring board, an alignment mark corresponding to the IC chip is provided. In the present case, an alignment mark is also provided at the IC chip, and alignment is achieved by observing both the alignment marks through the above-mentioned through hole. Accordingly, there is no need to perform the positional alignment with the complicated system as in the prior art, thereby allowing the fine-pitch terminals to be aligned with each other with high accuracy.

According to the panel assembly structure of an embodiment, the second connection material for connecting the output side electrode and the input side electrode of the IC chip respectively with the output side wiring line and the input side wiring line of the flexible wiring board is provided by solder. Therefore, the second connection material can be supplied to each IC chip in a wafer state before the wafer is divided into individual drive IC chips. When the second connection material is supplied to each IC in the wafer state, the material can be supplied at a lower cost than when it is supplied to each one in a chip state. Furthermore, rework (restoration of defective components) is facilitated after the IC chip is mounted on the substrate surface, consequently allowing the manufacturing cost to be reduced.

According to the panel assembly structure of an embodiment, the second connection material is provided by an anisotropic conductive film. Therefore, the second connection material can be supplied to a tape-shaped (sheet-shaped rolled) material before the tape-shaped material is divided into individual flexible wiring boards. When the second connection material is supplied to the tape-shaped material, the connection material can be easily automatically supplied at a cost lower than in the case where the connection material is supplied to each one in a chip form. Furthermore, when the second connection material is provided by an anisotropic conductive film, the terminal material can be selected from various sorts of terminal materials to be used for the connection in comparison with the case of solder. For instance, an inexpensive material of aluminum can be selected as a material for the output side wiring line and the input side wiring line of the flexible wiring board, and consequently a reduced cost is achieved. Furthermore, by adopting an anisotropic conductive film as the first, second, and third connection materials, an identical sort of connection material is used as the connection materials.

According to the panel assembly structure of an embodiment, the first, second and third connection materials are provided by an identical connection material, and therefore the reliability of connection portions using the first, second and third connection materials is adjusted to the same level. Furthermore, a plurality of connection portions can be simultaneously connected by one connecting apparatus. Therefore, a reduced number of manufacturing processes is achieved. Further, the apparatuses necessary for obtaining a specified throughput is reduced in number, thereby allowing an investment cost for the equipment to be reduced. Further, as a result of the reduction in number of apparatuses, the occupation area of the processes in the factory is reduced. Therefore, a remarkable cost reduction can be achieved.

According to the panel assembly structure of an embodiment, the first, second and third connection materials are provided integratedly, and therefore the first, second and third connection materials are supplied to a normally rolled substrate simultaneously by one supply apparatus. Therefore, the manufacturing processes can be reduced in number. Further, the apparatuses necessary for obtaining a specified throughput can be reduced in number, thereby allowing an investment cost for the equipment to be reduced. Further, as a result of the reduction in number of apparatuses, the occupation area of the processes in the factory is reduced. Therefore, a substantial cost reduction can be achieved.

According to the panel assembly structure of an embodiment, at least one of the area in which the IC chip is mounted and the area in which the output terminal is formed, each area belonging to the flexible wiring board, has a thickness smaller than the thickness of the other area of the substrate of the flexible wiring board. The above-mentioned arrangement leads to a reduction in temperature distribution in the direction of the thickness of the area in the connecting process. Therefore, the temperature of heating is set low. When the temperature of heating is set low, if a difference in coefficient of thermal expansion exists between the panel and the flexible wiring board connected with each other or between the IC chip and the flexible wiring board connected with each other, a residual stress due to the difference in coefficient of thermal expansion can be reduced after the connecting process. Furthermore, the fact that the thickness of the substrate of the flexible wiring board is thin can also reduce the total amount of residual stress. Therefore, the reliability of the connection portions is improved.

According to the panel assembly structure of an embodiment, the panel and the wiring board are integratedly formed, and therefore connection on the output side and the input side of the flexible wiring board is simultaneously performed by one connecting apparatus. Therefore, the manufacturing processes is reduced in number. Further, the apparatuses necessary for obtaining a specified throughput can be reduced in number, thereby allowing an investment cost for the equipment to be reduced. Further, as a result of the reduction in number of apparatuses, the occupation area of the processes in the factory can be reduced. Therefore, a remarkable cost reduction is achieved.

According to the IC mounting tape of an embodiment, a film-like substrate extending in one direction is provided, and IC chips are mounted on a substrate surface of the substrate in one or a plurality of lines in the lengthwise direction of the substrate. Therefore, the tape can be easily manufactured automatically continuously. In other words, a connection material for connecting the output side wiring line and the input side wiring line respectively with the output side electrode and the input side electrode of each IC chip, a connection material provided on the output side wiring line and the input side wiring line for the connection thereof with external electrodes, and members such as IC chips are continuously supplied onto the film-like substrate. The above-mentioned process is easily automated. Consequently, an increased productivity is achieved to allow the manufacturing cost to be reduced in comparison with the case where flexible wiring boards are manufactured individually.

Furthermore, a through hole having plane dimensions smaller than plane dimensions of the IC chip is provided in the area which belongs to a substrate surface and in which the IC chip is mounted, while the portions which belong respectively to the output side wiring line and the input side wiring line and are connected respectively with the output side electrode and the input side electrode of the IC chip are supported by the substrate surface around the through hole. Therefore, the portions can be prevented from being bent in the process of mounting the IC chip or other manufacturing processes. Therefore, the amount of protrusion of the output side wiring line and the input side wiring line from the substrate surface is reduced (the thickness of each wiring line is made thin) further than in the prior art. The amount of protrusion can be set to $1.8 \times 10^{-2}$ mm or less. When the amount of protrusion is set to such a reduced value, the output side wiring line and the input side wiring line are finished with high etching accuracy. Therefore, connection of the output side wiring line and the input side wiring line respectively with the output side electrode and the input side electrode of the IC chip can be performed at a pitch finer than in the prior art. Furthermore, connection of the output side wiring line and the input side wiring line with external panels of various sorts and the like can be also achieved at a fine pitch.

On the other hand, the through hole is formed in the area in which the IC chip is mounted, whereby a superfluous substrate portion is removed. Therefore, the possible misalignment between the electrodes of the IC chip and the output side wiring line and the input side wiring line due to the influence of thermal expansion of the substrate material in the process of mounting the IC chip by thermocompression bonding is be reduced, so that the connection reliability is improved. Furthermore, the residual stress of the substrate is also reduced, and therefore the reliability of connection between the mutually opposite terminals is further improved.

Furthermore, for example, by extending in a specified pattern a part of the wiring layer from on the substrate surface around the through hole to the inside of the through hole in the area of the through hole at the substrate surface, an alignment mark corresponding to the IC chip can be provided. In the above-mentioned case, an alignment mark is also provided at the IC chip, and alignment is achieved by observing both the alignment marks through the above-mentioned through hole. Accordingly, there is no need to perform the positional alignment with the complicated system as in the prior art, thereby allowing the fine-pitch terminals to be aligned with each other with high accuracy.

According to the IC mounting tape of an embodiment, one or a plurality of the connection materials are belt-shaped, and provided in the lengthwise direction of the substrate and each connection material corresponds to at least one line of IC chips. Therefore, the connection material can be supplied at a time in the lengthwise direction of the substrate in the manufacturing process. Therefore, an increased productivity is achieved to allow the manufacturing cost to be reduced in comparison with the case where the connection material is supplied to each individual flexible wiring board.

According to the IC mounting tape of an embodiment, a terminal connected to the output side wiring line or the input side wiring line is provided outside the area in which the belt-shaped connection material is provided on the substrate surface. Therefore, by using the terminal as an inspection terminal and putting a probe pin for electrical inspection in contact with the terminal (inspection terminal), a function test of the IC chip and a connection test of the connection portions are performed in the middle of the assembling process. When a defective component is extracted as a result of each test, removal or rework is performed in early stages. Therefore, the manufacturing cost is totally reduced.

According to the IC mounting tape of an embodiment, the output side wiring line, the input side wiring line, and the belt-shaped connection material are provided on one surface of the substrate, while a terminal connected to the output side wiring line or the input side wiring line is provided on the substrate surface opposite from the above-mentioned one substrate surface. The terminal is provided compactly on the rear side of the substrate for the output side wiring line and the input side wiring line without increasing the area of the substrate nor accompanying cost increase. By using the terminal as an inspection terminal and putting a probe pin for electrical inspection in contact with the terminal (inspection terminal), a function test of the IC chip and a connection test of the connection portions can be performed in the middle of the assembling process. When a defective component is extracted as a result of each test, removal or rework is performed in early stages. Therefore, the manufacturing cost can be totally reduced. Furthermore, after the substrate is divided into individual flexible wiring boards, the above-mentioned terminal can be used as an inspection terminal with the board connected to any of various external panels and the like. In other words, a panel of each sort can be compactly assembled with provision of the inspection terminal.

According to the IC mounting tape manufacturing method of the present invention, a substrate and one or a plurality of belt-shaped connection materials are fed in a stack in a lengthwise direction thereof onto a specified stage, and then subjected to a heating or pressure applying process, or a heating and pressure applying process on the stage, so that the substrate and the belt-shaped connection material are integrated continuously in the lengthwise direction. Therefore, the connection material can be supplied at a time in the lengthwise direction of the substrate. Therefore, an increased productivity is achieved to allow the manufacturing cost to be reduced in comparison with the case where the connection material is supplied to each individual flexible wiring board.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A panel assembly structure including: a flexible wiring board provided with a film-like substrate having a flexibility; an integrated circuit chip mounted in a specified area on a surface of the substrate, said integrated circuit chip having an output side electrode and an input side electrode connected respectively with an output side wiring line and an input side wiring line provided on the surface of the substrate each via a second connection material; a panel of which a peripheral portion has an electrode terminal, said electrode terminal being connected with an output terminal comprised of a part of the output side wiring line of the flexible wiring board via a first connection material; and a wiring board which has an electrode terminal for supplying a signal to the integrated circuit chip, said electrode terminal being connected with an input terminal comprised of a part of the input side wiring line of the flexible wiring board via a third connection material, wherein an area which belongs to the surface of the substrate of the flexible wiring board and in which the integrated circuit chip is mounted is provided with a through hole which penetrates the substrate and has plane dimensions smaller than plane dimensions of the integrated circuit chip, and portions which belong respectively to the output side wiring line and the input side wiring line and are connected respectively with the output side electrode and the input side electrode of the integrated circuit chip are supported by the surface of the substrate around the through hole.

2. A panel assembly structure as claimed in claim 1, wherein the second connection material is solder.

3. A panel assembly structure as claimed in claim 1, wherein the second connection material is an anisotropic conductive film.

4. A panel assembly structure as claimed in claim 1, wherein the first, second and third connection materials are provided by a connection material of an identical sort.

5. A panel assembly structure as claimed in claim 1, wherein the first, second and third connection materials are provided integratedly.

6. A panel assembly structure as claimed in claim 1, wherein at least one of the area in which the integrated circuit chip is mounted and the area in which the output terminal is formed, said areas belonging to the substrate of the flexible wiring board, has a thickness smaller than a thickness of the other area of the substrate of the flexible wiring board.

7. A panel assembly structure as claimed in claim 1, wherein the panel and the wiring board are formed integratedly.

* * * * *